US007829956B2

United States Patent
Kotani

(10) Patent No.: US 7,829,956 B2
(45) Date of Patent: Nov. 9, 2010

(54) SRAM SEMICONDUCTOR DEVICE WITH A COMPRESSIVE STRESS-INDUCING INSULATING FILM AND A TENSILE STRESS-INDUCING INSULATING FILM

(75) Inventor: Naoki Kotani, Hyogo (JP)

(73) Assignee: Panasonic Corporation, Osaka (JP)

( * ) Notice: Subject to any disclaimer, the term of this patent is extended or adjusted under 35 U.S.C. 154(b) by 726 days.

(21) Appl. No.: 11/518,169

(22) Filed: Sep. 11, 2006

(65) Prior Publication Data

US 2007/0085151 A1    Apr. 19, 2007

(30) Foreign Application Priority Data

Oct. 14, 2005    (JP)    ............. 2005-300703

(51) Int. Cl.
*H01L 27/092*    (2006.01)
(52) U.S. Cl. .............. 257/389; 257/903; 257/E27.064; 257/E27.098
(58) Field of Classification Search ............. 257/38, 257/391, 392, 389
See application file for complete search history.

(56) References Cited

U.S. PATENT DOCUMENTS

| 6,984,564 | B1 * | 1/2006 | Huang et al. ............... 438/275 |
| 2003/0181005 | A1 * | 9/2003 | Hachimine et al. .......... 438/231 |
| 2004/0159905 | A1 * | 8/2004 | Sato ........................... 257/506 |
| 2005/0285202 | A1 * | 12/2005 | Huang et al. ............... 257/368 |
| 2006/0046400 | A1 * | 3/2006 | Burbach et al. ............. 438/282 |
| 2006/0226490 | A1 * | 10/2006 | Burnett et al. .............. 257/365 |

FOREIGN PATENT DOCUMENTS

| JP | 2002-76182 | 3/2002 |
| JP | 2003-273240 | 9/2003 |

* cited by examiner

*Primary Examiner*—Wael M Fahmy
*Assistant Examiner*—Abul Kalam
(74) *Attorney, Agent, or Firm*—McDermott Will & Emery LLP

(57) ABSTRACT

Both a compressive-stress-applying insulating film and a tensile-stress-applying insulating film cover an N-type MIS transistor formed at an SRAM access region of a semiconductor substrate. On the other hand, a tensile-stress-applying insulating film covers an N-type MIS transistor formed at an SRAM drive region of the semiconductor substrate.

17 Claims, 26 Drawing Sheets

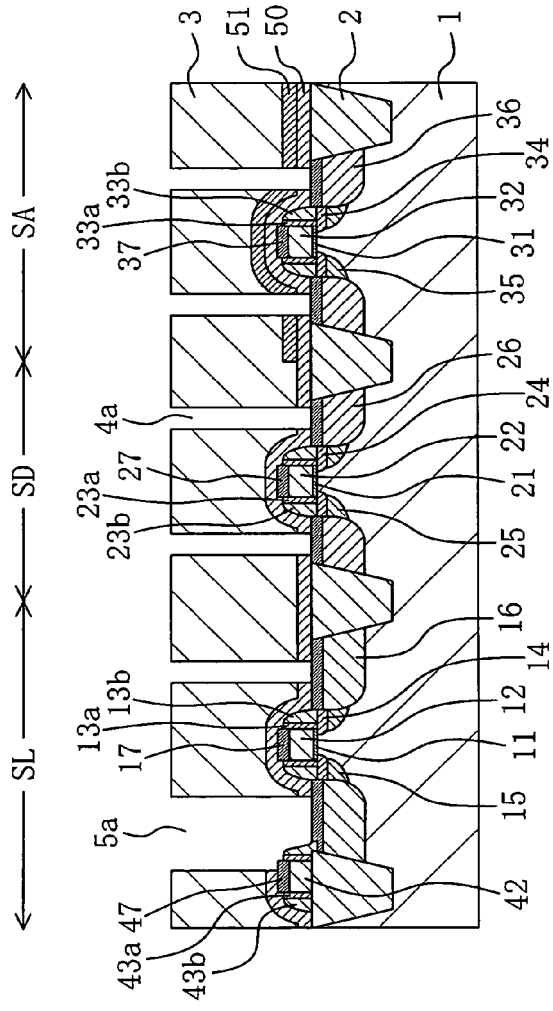
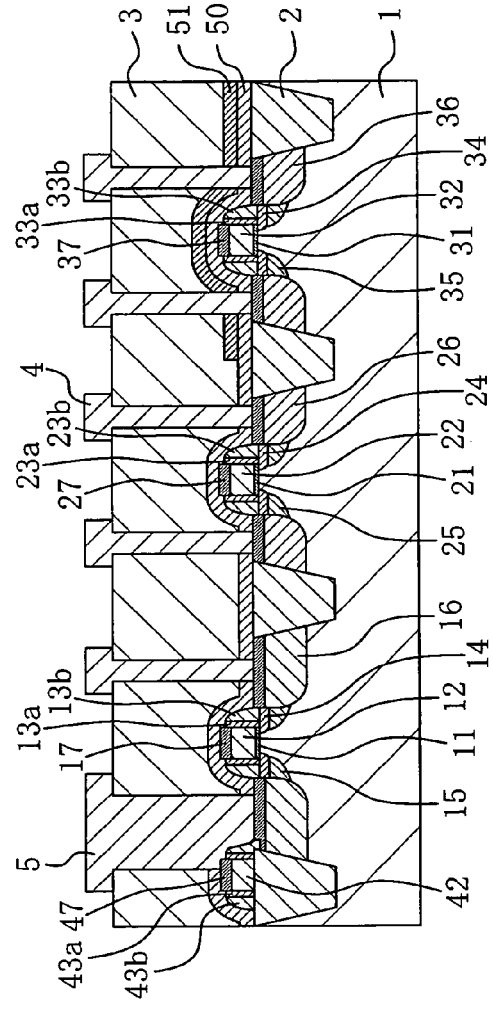
FIG. 5A
FIG. 5B

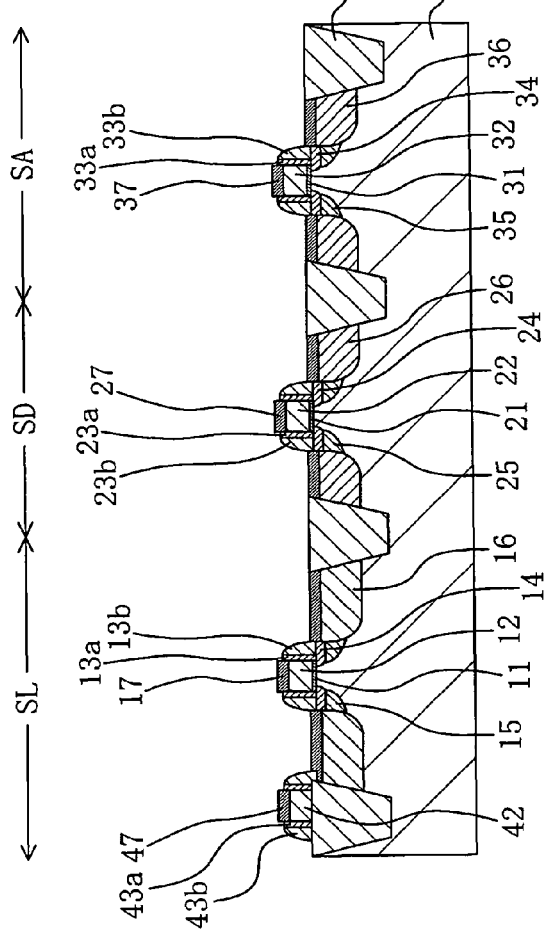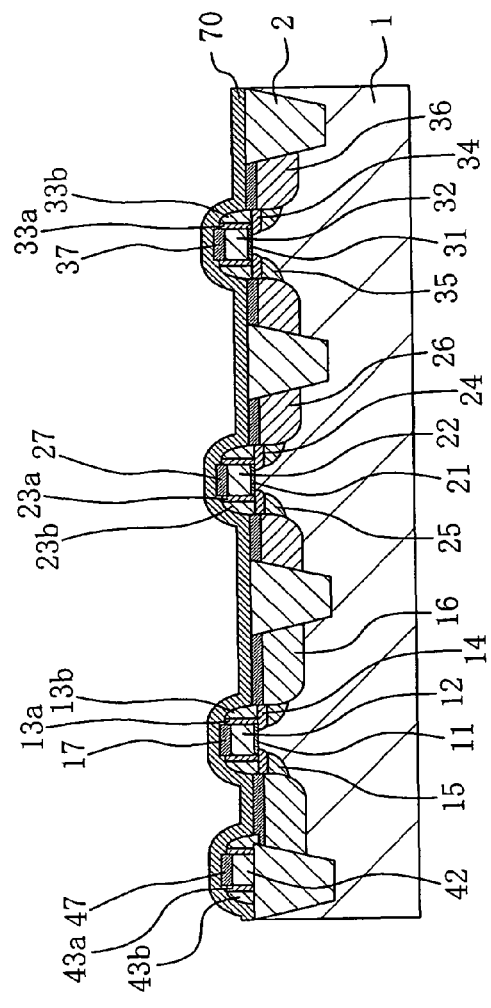
FIG. 12A
FIG. 12B

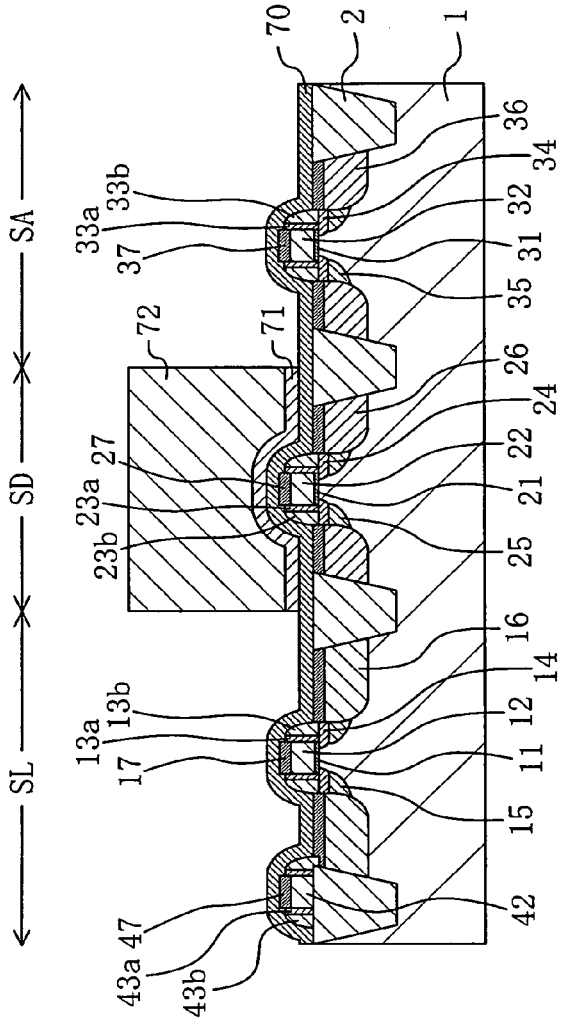
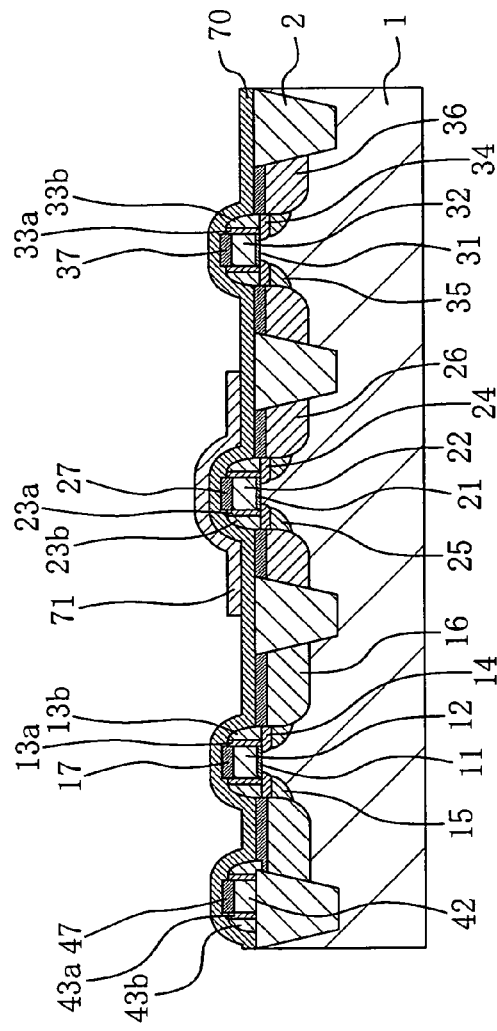
FIG. 14A
FIG. 14B

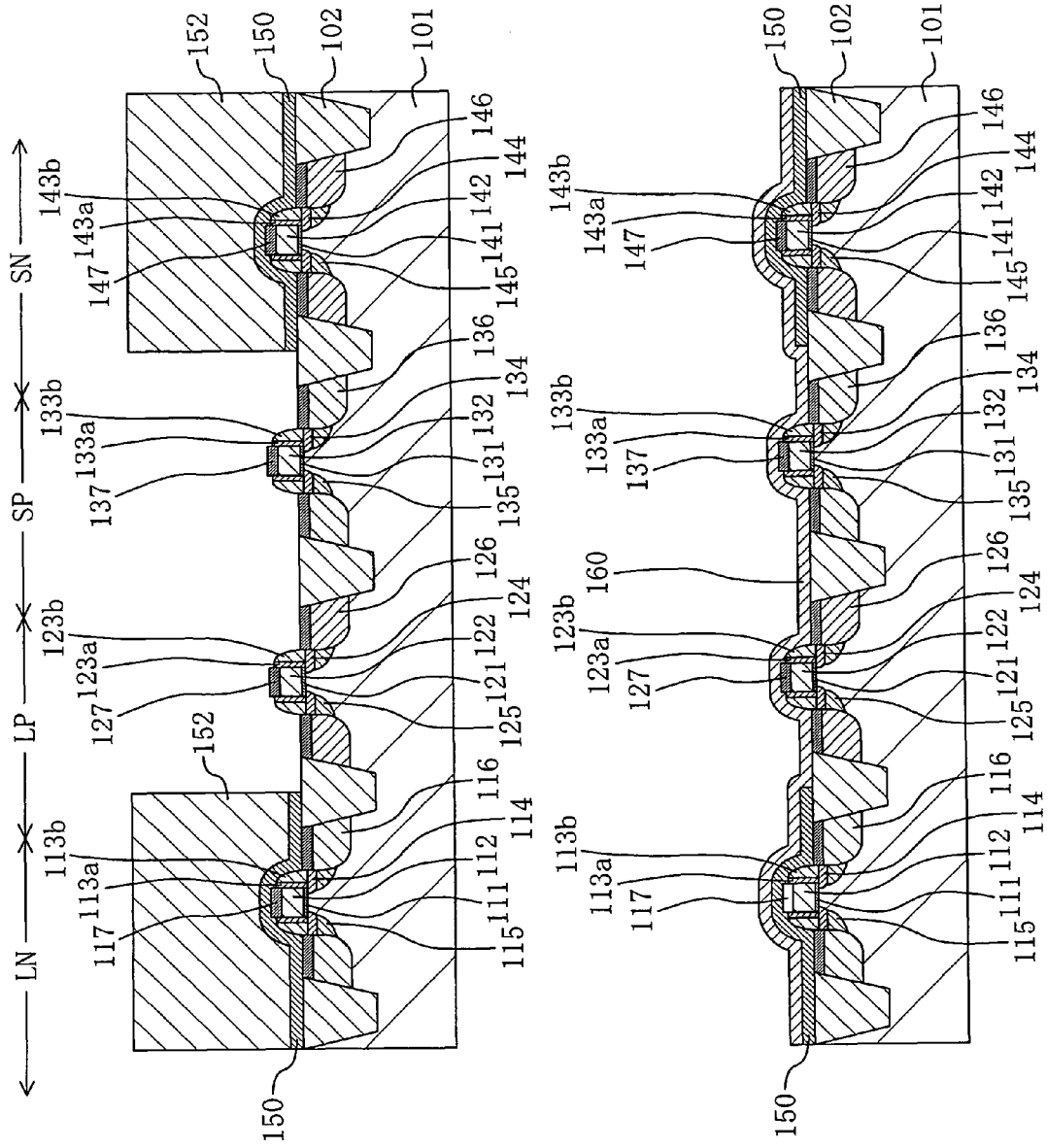

SRAM SEMICONDUCTOR DEVICE WITH A COMPRESSIVE STRESS-INDUCING INSULATING FILM AND A TENSILE STRESS-INDUCING INSULATING FILM

BACKGROUND OF THE INVENTION

1) Field of the Invention

The present invention relates to semiconductor devices and methods for fabricating the same.

2) Description of Related Art

In recent years, rapid miniaturization in the field of semiconductor devices has spurred the trends toward higher-speed operation and lower power consumption. Accordingly, the need for improvement in transistor performance becomes imperative. However, improvement in performance only by miniaturization will soon hit a ceiling. To cope with this, various novel techniques, such as a technique in which stress is applied to the channel region of a MIS transistor, have been developed to enhance the performance of a MIS transistor.

FIG. 26 is a cross-sectional view illustrating the configuration of MIS transistors on which stress-applying films are formed according to a known art. In the configuration illustrated in FIG. 26, an N-channel MIS transistor 201 is covered with a LP-CVD (low-pressure chemical vapor deposition) film 203 generating tensile stress, and a P-channel MIS transistor 202 is covered with a plasma CVD film 204 generating compressive stress, thereby enhancing the performance of each MIS transistor (see, for example, Japanese Unexamined Patent Publication No. 2003-273240).

FIG. 27 is a plan view illustrating the configuration of transistors forming an SRAM according to a known art. As illustrated in FIG. 27, in the known SRAM, an active region 303 of an access transistor TrA has a narrower width (channel width) than an active region 304 of a drive transistor TrD. For this structure, when the drive transistor TrD has a higher performance than the access transistor TrA, this can suppress malfunction of the SRAM.

However, the above-mentioned method in which the active region 303 of the access transistor TrA has a different width from the active region 304 of the drive transistor TrD places limitations on the layout of transistors. When deviations from the proper locations of transistors are caused, for example, due to a lithography process in fabrication of transistors, the gate length and channel width of each transistor cannot be adjusted to desired values. This has the opposite effect of allowing the transistor characteristics to significantly vary. When a large fabrication margin is provided to prevent the above-mentioned opposite effect, this prevents the size of cells from being miniaturized.

The above-mentioned problems are caused not only in transistors forming SRAMs but also in any transistor formed on a wafer as long as the performance of transistors needs to be adjusted.

SUMMARY OF THE INVENTION

In order to solve the above-mentioned problems, it is an object of the present invention to adjust the driving force of each of MIS transistors using a film covering the MIS transistor.

A semiconductor device according to a first aspect of the present invention includes: a first MIS transistor including a first gate insulating film formed on a first active region of a semiconductor layer, a first gate electrode formed on the first gate insulating film, and first source/drain regions of an N type formed in regions of the first active region located to both sides of the first gate electrode; a first insulating film covering the first source/drain regions and the first gate electrode and having a compressive stress; and an interlayer dielectric covering the first insulating film.

According to the semiconductor device of the first aspect of the present invention, the first insulating film having a compressive stress can decrease the performance of the first MIS transistor of the N type. This permits adjustment between the driving force of the first MIS transistor and that of another transistor.

According to a second aspect of the present invention, the semiconductor device of the first aspect of the present invention may further include: a second MIS transistor including a second gate insulating film formed on a second active region of the semiconductor layer, a second gate electrode formed on the second gate insulating film, and second source/drain regions of the N type formed in regions of the second active region located to both sides of the second gate electrode; and a second insulating film covering the second source/drain regions and the second gate electrode and having a tensile stress. In this case, when the second insulating film having a tensile stress is formed to cover the second MIS transistor of the N-type, this can enhance the driving force of the second MIS transistor. In view of the above, the driving force of the first MIS transistor can be decreased, and that of the second MIS transistor can be enhanced. This permits adjustment between the driving forces of two transistors.

According to a third aspect of the present invention, the semiconductor device of the first aspect of the present invention may further include a third MIS transistor including a third gate insulating film formed on a third active region of the semiconductor layer, a third gate electrode formed on the third gate insulating film, and third source/drain regions of a P type formed in regions of the third active region located to both sides of the third gate electrode.

According to a fourth aspect of the present invention, in the semiconductor device of the third aspect of the present invention, the third source/drain regions and the third gate electrode may be covered with a third insulating film having a compressive stress.

According to a fifth aspect of the present invention, in the semiconductor device of the second aspect of the present invention, a layered film of the first insulating film having a compressive stress and an insulating film having a tensile stress may cover the first source/drain regions and the first gate electrode, and an insulating film having a compressive stress does not have to be formed to cover the second source/drain regions and the second gate electrode. This also allows the first MIS transistor to have a lower driving force than the second MIS transistor.

According to a sixth aspect of the present invention, in the semiconductor device of the second aspect, an insulating film having a tensile stress does not have to be formed to cover the first source/drain regions and the first gate electrode, and a layered film of the second insulating film having a tensile stress and an insulating film having a compressive stress may cover the second source/drain regions and the second gate electrode. This also allows the first MIS transistor to have a lower driving force than the second MIS transistor.

According to a seventh aspect of the present invention, the semiconductor device of the second aspect may further include a third MIS transistor including a third gate insulating film formed on a third active region of the semiconductor layer, a third gate electrode formed on the third gate insulating film, and third source/drain regions of a P type formed in regions of the third active region located to both sides of the third gate electrode. The first MIS transistor may be an access transistor for an SRAM, the second MIS transistor may be a drive transistor for the SRAM, and the third MIS transistor may be a load transistor for the SRAM. This allows the access transistor to have a lower driving force than the drive transistor. This can certainly suppress malfunction of the SRAM.

According to an eighth aspect of the present invention, in the semiconductor device of the second aspect, the first MIS transistor may be a transistor forming an SRAM, and the second MIS transistor may be a transistor forming a logic element.

According to a ninth aspect of the present invention, the semiconductor device of the eighth aspect may further include: a fourth MIS transistor including a fourth gate insulating film formed on a fourth active region of the semiconductor layer, a fourth gate electrode formed on the fourth gate insulating film, and fourth source/drain regions of a P type formed in regions of the fourth active region located to both sides of the fourth gate electrode; a fifth MIS transistor including a fifth gate insulating film formed on a fifth active region of the semiconductor layer, a fifth gate electrode formed on the fifth gate insulating film, and fifth source/drain regions of a P type formed in regions of the fifth active region located to both sides of the fifth gate electrode; a fourth insulating film covering the fourth source/drain regions and the fourth gate electrode and having a compressive stress; and a fifth insulating film covering the fifth source/drain regions and the fifth gate electrode and having a tensile stress. The fourth MIS transistor may be a transistor forming a logic element, and the fifth MIS transistor may be a transistor forming an SRAM.

According to a tenth aspect of the present invention, a semiconductor device includes: a first MIS transistor including a first gate insulating film formed on a first active region of a semiconductor layer, a first gate electrode formed on the first gate insulating film, and first source/drain regions of a P type formed in regions of the first active region located to both sides of the first gate electrode; a first insulating film covering the first source/drain regions and the first gate electrode and having a compressive stress; and an interlayer dielectric covering the first insulating film.

According to the semiconductor device of the tenth aspect of the present invention, the second insulating film having a tensile stress can decrease the performance of the first MIS transistor of the P type. This permits adjustment between the driving force of the first MIS transistor and that of another transistor.

According to an eleventh aspect of the present invention, a method for fabricating a semiconductor device including a first MIS transistor including a first gate insulating film formed on a first active region of a semiconductor layer, a first gate electrode formed on the first gate insulating film, and first source/drain regions of an N type formed in regions of the first active region located to both sides of the first gate electrode, includes the steps of: (a) forming a first insulating film having a compressive stress to cover the first source/drain regions and the gate electrode; and (b) forming an interlayer dielectric to cover the first insulating film.

According to the method of the eleventh aspect of the present invention, formation of the first insulating film having a compressive stress can decrease the performance of the first MIS transistor of the N type. This permits adjustment between the driving force of the first MIS transistor and that of another transistor.

According to a twelfth aspect of the present invention, in the method of the eleventh aspect, the semiconductor device may further include a second MIS transistor including a second gate insulating film formed on a second active region of a semiconductor layer, a second gate electrode formed on the second gate insulating film, and second source/drain regions of an N type formed in regions of the second active region located to both sides of the second gate electrode, and the method may further include the step of (c), before the step (b), forming a second insulating film having a tensile stress to cover the second source/drain regions and the second gate electrode. In this case, when the second insulating film having a tensile stress is formed to cover the second MIS transistor of the N-type, this can enhance the driving force of the second MIS transistor. In view of the above, the driving force of the first MIS transistor can be decreased, and that of the second MIS transistor can be enhanced. This permits adjustment between the driving forces of two transistors.

According to a thirteenth aspect of the present invention, in the method of the eleventh aspect, the semiconductor device may further include a third MIS transistor including a third gate insulating film formed on a third active region of the semiconductor layer, a third gate electrode formed on the third gate insulating film, and third source/drain regions of a P type formed in regions of the third active region located to both sides of the third gate electrode.

According to a fourteenth aspect of the present invention, the method of the thirteenth aspect may further include the step of forming a third insulating film having a compressive stress to cover the third source/drain regions and the third gate electrode.

According to a fifteenth aspect of the present invention, in the method of the twelfth aspect, in the step (a), a layered film of the first insulating film and an insulating film having a tensile stress may be formed to cover the first source/drain regions and the first gate electrode, and in the step (c), only the second insulating film may be formed to cover the second source/drain regions and the second gate electrode. This also allows the first MIS transistor to have a lower driving force than the second MIS transistor.

According to a sixteenth aspect of the present invention, in the method of the twelfth aspect, in the step (a), only the first insulating film may be formed to cover the first source/drain regions and the first gate electrode, and in the step (c), a layered film of the second insulating film and an insulating film having a compressive stress may be formed to cover the second source/drain regions and the second gate electrode. This also allows the first MIS transistor to have a lower driving force than the second MIS transistor.

According to a seventeenth aspect of the present invention, in the method of the twelfth aspect, the semiconductor device may further include a third MIS transistor including a third gate insulating film formed on a third active region of the semiconductor layer, a third gate electrode formed on the third gate insulating film, and third source/drain regions of a P type formed in regions of the third active region located to both sides of the third gate electrode, the first MIS transistor may be an access transistor for an SRAM, the second MIS transistor may be a drive transistor for the SRAM, and the third MIS transistor may be a load transistor for the SRAM.

According to an eighteenth aspect of the present invention, in the method of the twelfth aspect, the first MIS transistor may be a transistor forming an SRAM, and the second MIS transistor may be a transistor forming a logic element.

According to a nineteenth aspect of the present invention, in the method of the eighteenth aspect, the semiconductor device may further include: a fourth MIS transistor including a fourth gate insulating film formed on a fourth active region of the semiconductor layer, a fourth gate electrode formed on the fourth gate insulating film, and fourth source/drain regions of a P type formed in regions of the fourth active region located to both sides of the fourth gate electrode, said fourth MIS transistor forming a logic element; and a fifth MIS transistor including a fifth gate insulating film formed on a fifth active region of the semiconductor layer, a fifth gate electrode formed on the fifth gate insulating film, and fifth source/drain regions of a P type formed in regions of the fifth active region located to both sides of the fifth gate electrode, said fifth MIS transistor forming an SRAM. The method may further include the steps of: before the step (b), forming a fourth insulating film having a compressive stress to cover the fourth source/drain regions and the fourth gate electrode; and before the step (b), forming a fifth insulating film having a tensile stress to cover the fifth source/drain regions and the fifth gate electrode.

According to a twentieth aspect of the present invention, a method for fabricating a semiconductor device including a first MIS transistor including a first gate insulating film formed on a first active region of a semiconductor layer, a first gate electrode formed on the first gate insulating film, and first source/drain regions of a P type formed in regions of the first active region located to both sides of the first gate electrode, includes the steps of: (a) forming a first insulating film having a tensile stress to cover the first source/drain regions and the gate electrode; and (b) forming an interlayer dielectric to cover the first insulating film.

According to the method of the twentieth aspect of the present invention, the second insulating film having a tensile stress can decrease the performance of the first MIS transistor of the P type. This permits adjustment between the driving force of the first MIS transistor and that of another transistor.

BRIEF DESCRIPTION OF THE DRAWINGS

FIGS. 5A and 5B are cross-sectional views illustrating some of the process steps in the fabrication method for a semiconductor device according to the first embodiment of the present invention.

FIGS. 12A and 12B are cross-sectional views illustrating some of process steps in a fabrication method for a semiconductor device according to the third embodiment of the present invention.

FIGS. 14A and 14B are cross-sectional views illustrating some of the process steps in the fabrication method for a semiconductor device according to the third embodiment of the present invention.

FIGS. 23A and 23B are cross-sectional views illustrating some of the process steps in the fabrication method for a semiconductor device according to the fifth embodiment of the present invention.

DETAILED DESCRIPTION OF THE INVENTION

A semiconductor device of the present invention and a fabrication method for the same will be described hereinafter with reference to the drawings.

Embodiment 1

Figure 1:
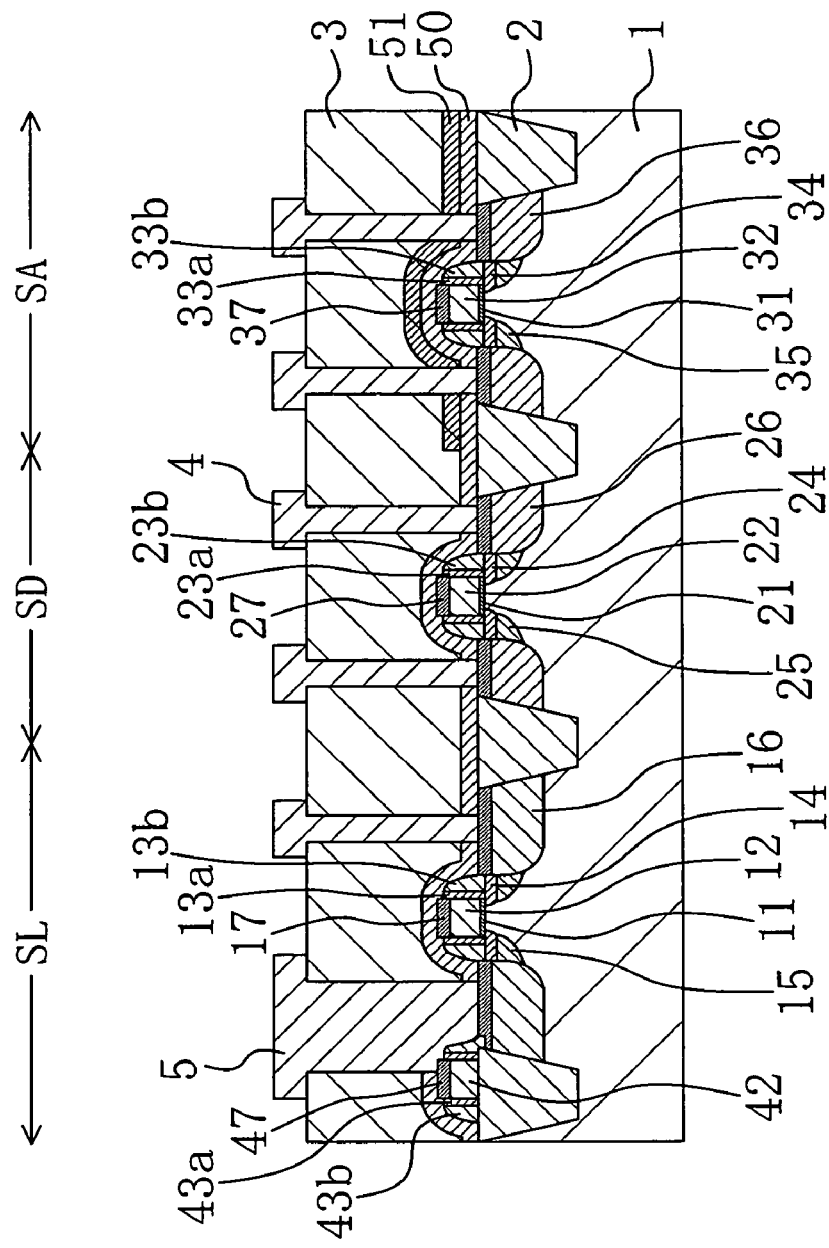
FIG. 1 is a cross-sectional view illustrating the structure of a semiconductor device according to a first embodiment of the present invention.

FIG. 1 is a cross-sectional view illustrating the structure of a semiconductor device according to a first embodiment of the present invention. As illustrated in FIG. 1, in the semiconductor device of this embodiment, a semiconductor substrate 1 is sectioned into an SRAM load region SL at which a load transistor for an SRAM is formed, an SRAM drive region SD at which a drive transistor for the SRAM is formed, and an SRAM access region SA at which an access transistor for the SRAM is formed. The regions SL, SD and SA are electrically isolated from one another by a shallow trench isolation region 2.

A gate electrode 12 is formed on the SRAM load region SL of the semiconductor substrate 1 with a gate insulating film 11 interposed therebetween. Offset sidewalls 13a and sidewalls 13b are formed on the side surfaces of the gate electrode 12, and the sidewalls 13b are located further from the gate electrode 12 than the offset sidewalls 13a. P-type extension regions 14 are formed in regions of the semiconductor substrate 1 located under the offset sidewalls 13a and the sidewalls 13b. N-type pocket regions 15 are formed in regions of the semiconductor substrate 1 located under the P-type extension regions 14. P-type source/drain regions 16 are formed in regions of the semiconductor substrate 1 located further from the gate electrode 12 than the sidewalls 13b. Silicide layers 17 are formed in the upper portion of the gate electrode 12 and the upper portions of the P-type source/drain regions 16.

A gate electrode 22 is formed on the SRAM drive region SD of the semiconductor substrate 1 with a gate insulating film 21 interposed therebetween. Offset sidewalls 23a and sidewalls 23b are formed on the side surfaces of the gate electrode 22, and the sidewalls 23b are located further from the gate electrode 22 than the offset sidewalls 23a. N-type extension regions 24 are formed in regions of the semiconductor substrate 1 located under the offset sidewalls 23a and the sidewalls 23b. P-type pocket regions 25 are formed in regions of the semiconductor substrate 1 located under the N-type extension regions 24. N-type source/drain regions 26 are formed in regions of the semiconductor substrate 1 located further from the gate electrode 22 than the sidewalls 23b. Silicide layers 27 are formed in the upper portion of the gate electrode 22 and the upper portions of the N-type source/drain regions 26.

A gate electrode 32 is formed on the SRAM access region SA of the semiconductor substrate 1 with a gate insulating film 31 interposed therebetween. Offset sidewalls 33a and sidewalls 33b are formed on the side surfaces of the gate electrode 32, and the sidewalls 33b are located further from the gate electrode 32 than the offset sidewalls 33a. N-type extension regions 34 are formed in regions of the semiconductor substrate 1 located under the offset sidewalls 33a and the sidewalls 33b. P-type pocket regions 35 are formed in regions of the semiconductor substrate 1 located under the N-type extension regions 34. N-type source/drain regions 36 are formed in regions of the semiconductor substrate 1 located further from the gate electrode 32 than the sidewalls 33b. Silicide layers 37 are formed in the upper portion of the gate electrode 32 and the upper portions of the N-type source/drain regions 36.

A gate interconnect 42 is formed on a part of the shallow trench isolation region 2 located around the SRAM load region SL. A silicide layer 47 is formed in the upper portion of the gate interconnect 42. Offset sidewalls 43a are formed on the side surfaces of the gate interconnect 42. Sidewalls 43b are formed on the side surfaces of the offset sidewalls 43a. The gate interconnect 42 represents a part of a gate electrode of another adjacent transistor (not shown) extending onto the above-mentioned part of the shallow trench isolation region 2.

For the SRAM load region SL and the SRAM drive region SD, an insulating film 50 generating tensile stress (hereinafter, referred to as "tensile-stress-applying insulating film 50") is formed by LP-CVD to cover the gate electrode 12, the P-type source/drain regions 16, the gate electrode 22, and N-type source/drain regions 26. A stress herein means a stress applied to a channel region of a substrate located under a gate electrode along the gate length direction. The tensile-stress-applying insulating film herein means an insulating film applying a tensile stress to a channel region of a substrate located under a gate electrode along the gate length direction.

For the SRAM access region SA, the tensile-stress-applying insulating film 50 is formed to cover the gate electrode 32 and the N-type source/drain regions 36. An insulating film 51 generating compressive stress (hereinafter, referred to as "compressive-stress-applying insulating film 51") is formed on the tensile-stress-applying insulating film 50 by plasma CVD. The compressive-stress-applying insulating film herein means an insulating film applying compressive stress to a channel region of a substrate located under a gate electrode along the gate length direction. In this embodiment, the tensile-stress-applying insulating film 50 may be stacked on the compressive-stress-applying insulating film 51.

On the regions SL, SD and SA, the compressive-stress-applying insulating film 51 and the tensile-stress-applying insulating film 50 are covered with an interlayer dielectric 3. Contacts 4 for the regions SL and SD are formed to pass through the interlayer dielectric 3 and the tensile-stress-applying insulating film 50 and reach one of the silicide layers 17 located in the upper portion of one of the source/drain regions 16 located near the region SD and two of the silicide layers 27 located in the upper portions of the source/drain regions 26. Contacts 4 for the region SA are formed to pass through the interlayer dielectric 3, the compressive-stress-applying insulating film 51 and the tensile-stress-applying insulating film 50 and reach two of the silicide layers 37 located in the upper portions of the source/drain regions 36. A shared contact 5 is formed astride the border between the SRAM load region SL and a region of the shallow trench isolation region 2 on which the gate interconnect 42 is formed (hereinafter, referred to as "gate interconnect 42 formation region") to pass through the interlayer dielectric 3 and the tensile-stress-applying insulating film 50 and come into contact with one of the silicide layers 17 located adjacent to the gate interconnect 42 formation region and the silicide layer 47 located in the upper portion of the gate interconnect 42.

Next, a fabrication method for a semiconductor device according to this embodiment will be described with reference to FIGS. 2A through 5B. FIGS. 2A through 5B are cross-sectional views illustrating process steps in the fabrication method for a semiconductor device according to the first embodiment.

Figure 2A:
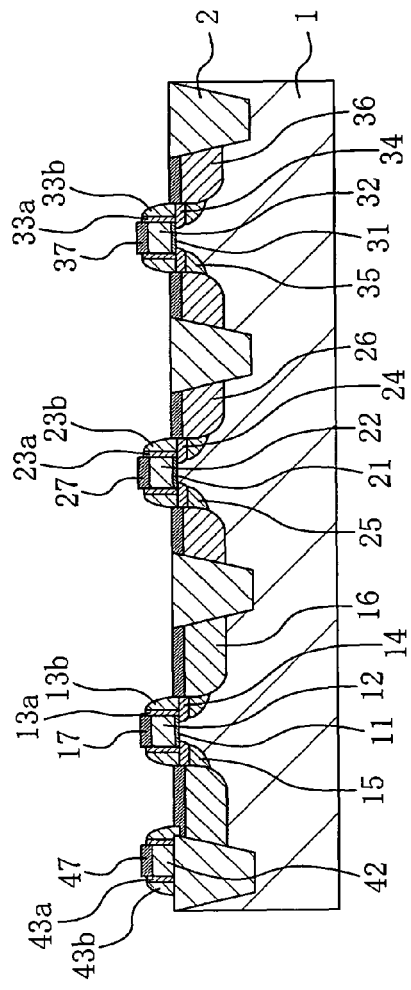
FIGS. 2A and 2B are cross-sectional views illustrating some of process steps in a fabrication method for a semiconductor device according to the first embodiment of the present invention.

In the fabrication method of this embodiment, the following process steps are carried out to provide the structure of the semiconductor device illustrated in FIG. 2A. Active regions of a semiconductor substrate 1, i.e., an SRAM load region SL, an SRAM drive region SD and an SRAM access region SA, are defined by a shallow trench isolation region 2 formed in the semiconductor substrate 1. A gate insulating film 11 and a gate electrode 12 are formed on the SRAM load region SL. A gate insulating film 21 and a gate electrode 22 are formed on the SRAM drive region SD. A gate insulating film 31 and a gate electrode 32 are formed on the SRAM access region SA. Simultaneously, a gate interconnect 42 is formed on the shallow trench isolation region 2. Offset sidewalls 13a, 23a, 33a, and 43a are formed on the side surfaces of the gate electrodes 12, 22 and 32 and the gate interconnect 42, respectively.

Subsequently, for example, arsenic ions serving as an N-type impurity are implanted into the SRAM drive region SD and the SRAM access region SA at an acceleration energy of 3 KeV, a dose of $1.5 \times 10^{15}/cm^2$ and a tilt angle of 0 degree using the gate electrodes 22 and 32 and the offset sidewalls 23a and 33a as masks. In this way, N-type extension regions 24 and 34 are formed in the regions SD and SA. Next, for example, boron ions serving as a P-type impurity are implanted into the SRAM drive region SD and the SRAM access region SA at an acceleration energy of 10 KeV, a dose of $8.0 \times 10^{12}/cm^2$ and a tilt angle of 25 degrees from four directions by rotating the wafer. In this way, P-type pocket regions 25 and 35 are formed in the regions SD and SA to cover the bottoms of the N-type extension regions 24 and 34.

Next, for example, boron ions serving as a P-type impurity are implanted into the SRAM load region SL at an acceleration energy of 0.5 KeV, a dose of $3.0 \times 10^{14}/cm^2$ and a tilt angle of 0 degree using the gate electrodes 12 and the offset sidewalls 13a as masks. In this way, P-type extension regions 14 are formed in the region SL. Next, for example, phosphorus ions serving as an N-type impurity are implanted into the SRAM load region SL at an acceleration energy of 30 KeV, a dose of $7.0 \times 10^{12}/cm^2$ and a tilt angle of 25 degrees from four directions by rotating the wafer. In this way, N-type pocket regions 15 are formed in the region SL to cover the bottoms of the P-type extension regions 14.

Next, a silicon nitride film is formed to cover the entire substrate area and then partly etched away by an etch-back process. Sidewalls 13b, 23b, 33b, and 43b are formed on the side surfaces of the gate electrodes 12, 22 and 32 and the gate interconnect 42 with the offset sidewalls 13a, 23a, 33a, and 43a interposed therebetween, respectively. Thereafter, for example, arsenic ions serving as an N-type impurity are implanted into the SRAM drive region SD and the SRAM access region SA at an acceleration energy of 20 KeV, a dose of $4.0 \times 10^{15}/cm^2$ and a tilt angle of 0 degree using the gate electrodes 22 and 32, the offset sidewalls 23a and 33a, and the sidewalls 23b and 33b as masks. Subsequently, for example, phosphorus ions serving as an N-type impurity are implanted into the regions SD and SA at an acceleration energy of 10 KeV, a dose of $1.0 \times 10^{15}/cm^2$ and a tilt angle of 7 degrees. In this way, N-type source/drain regions 26 and 36 are formed in the regions SD and SA.

Next, for example, boron ions serving as a P-type impurity are implanted into the SRAM load region SL at an acceleration energy of 2 KeV, a dose of $4.0 \times 10^{15}/cm^2$ and a tilt angle of 7 degrees using the gate electrode 12, the offset sidewalls 13a and the sidewalls 13b as masks. In this way, P-type source/drain regions 16 are formed in the region SL.

Silicide layers 17 are selectively formed in the respective upper portions of the gate electrode 12 and the source/drain regions 16 using a salicide technology. Likewise, silicide layers 27 are selectively formed in the respective upper portions of the gate electrode 22 and the source/drain regions 26, silicide layers 37 are selectively formed in the respective upper portions of the gate electrode 32 and the source/drain regions 36, and a silicide layer 47 is selectively formed in the upper portion of the gate interconnect 42. After the above-mentioned process steps, the structure of the semiconductor device illustrated in FIG. 2A can be provided.

Figure 2B:
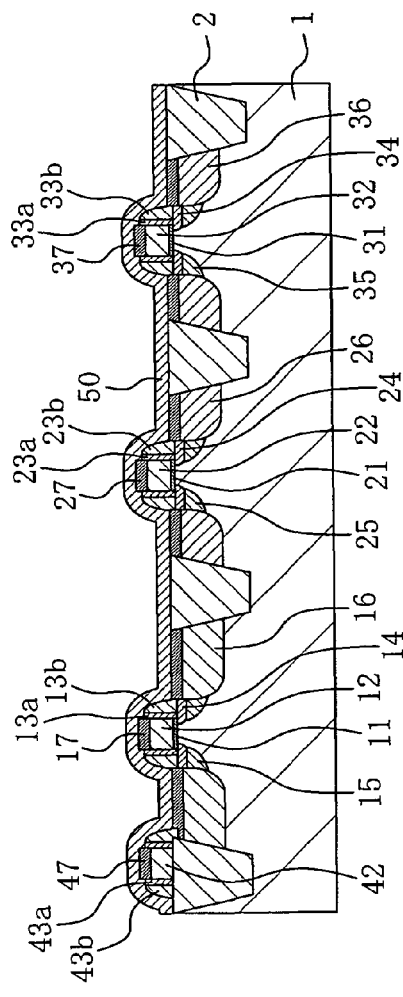

Next, in the process step illustrated in FIG. 2B, a tensile-stress-applying insulating film 50 of silicon nitride generating tensile stress is formed by LP-CVD to cover the entire substrate area.

Figure 3A:
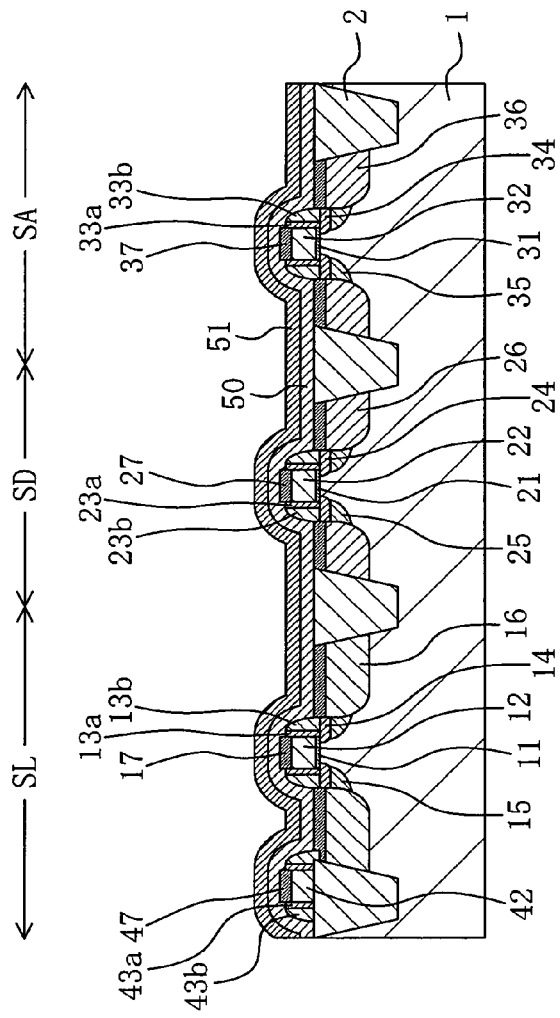
FIGS. 3A and 3B are cross-sectional views illustrating some of the process steps in the fabrication method for a semiconductor device according to the first embodiment of the present invention.

Next, in the process step illustrated in FIG. 3A, a compressive-stress-applying insulating film 51 of silicon nitride generating compressive stress is formed by plasma CVD to cover the entire substrate area.

Figure 3B:
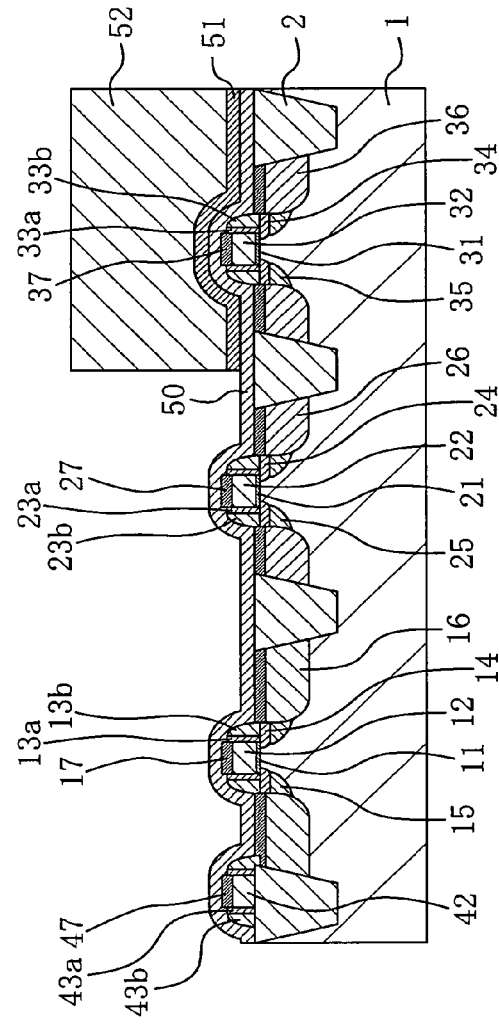

Next, in the process step illustrated in FIG. 3B, a first mask 52 of a resist is formed to expose the SRAM load region SL and the SRAM drive region SD and cover the SRAM access region SA. Thereafter, a portion of the compressive-stress-applying insulating film 51 covering the SRAM load region SL and the SRAM drive region SD is etched away using the first mask 52 as a mask for etching.

Figure 4A:
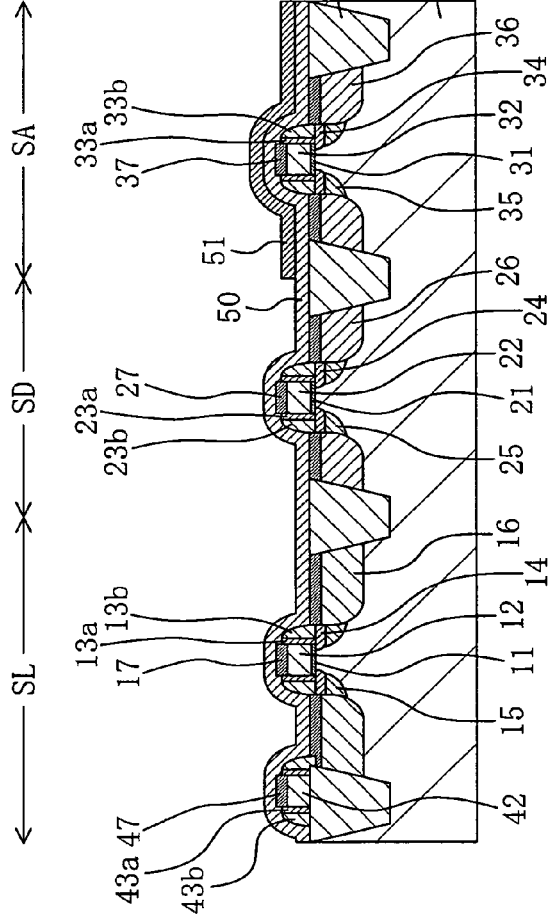
FIGS. 4A and 4B are cross-sectional views illustrating some of the process steps in the fabrication method for a semiconductor device according to the first embodiment of the present invention.

Next, in the process step illustrated in FIG. 4A, the first mask 52 is removed. At this point of time, a layered film of the compressive-stress-applying insulating film 51 and the tensile-stress-applying insulating film 52 exist on the SRAM access region SA. On the other hand, the compressive-stress-applying insulating film 51 does not exist on the SRAM load region SL and the SRAM drive region SD.

Figure 4B:
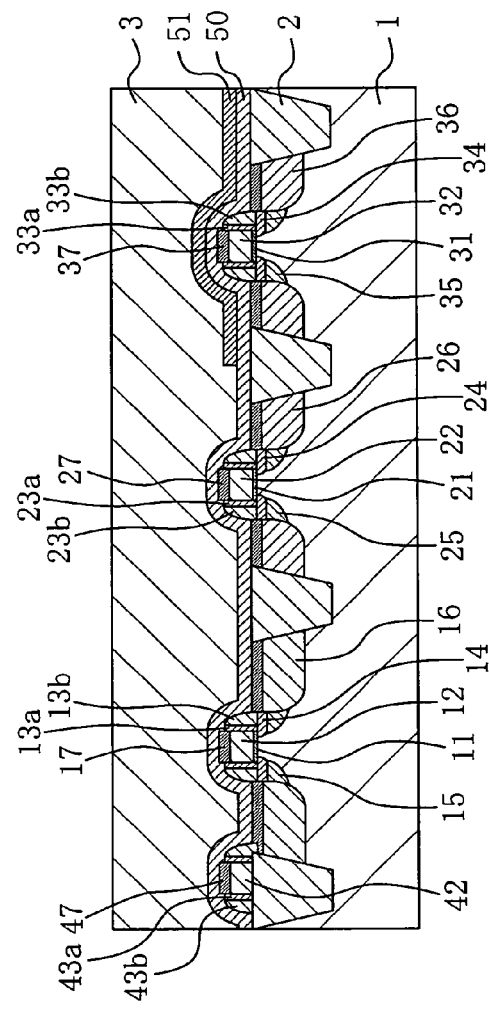

Next, in the process step illustrated in FIG. 4B, an interlayer dielectric 3 of an oxide film is formed to cover the entire substrate area.

Next, in the process step illustrated in FIG. 5A, contact holes 4a for the regions SL and SD are formed to pass through the interlayer dielectric 3 and the tensile-stress-applying insulating film 50 and reach one of the silicide layers 17 located in the upper portion of one of the source/drain regions 16 located near the region SD and two of the silicide layers 27 located in the upper portions of the source/drain regions 26. Contact holes 4a for the region SA are formed to pass through the interlayer dielectric 3, the compressive-stress-applying insulating film 51 and the tensile-stress-applying insulating film 50 and reach two of the silicide layers 37 located in the upper portions of the source/drain regions 36. Furthermore, a shared contact hole 5a is formed astride the border between the SRAM load region SL and the gate interconnect 42 formation region to pass through the interlayer dielectric 3 and the tensile-stress-applying insulating film 50 and reach one of the silicide layers 17 located in the upper portion of the one of the source/drain regions 16 adjacent to the gate interconnect 42 formation region and the silicide layer 47 located in the upper portion of the gate interconnect 42.

Next, in the process step illustrated in FIG. 5B, buried contacts 4 and a shared contact 5 all made of a barrier film of TiN or any other material and a metal film of tungsten or any other metal are formed to fill the contact holes 4a and the shared contact hole 5a. After the above-mentioned process steps, the semiconductor device of this embodiment is fabricated.

According to the semiconductor device of this embodiment, while an access transistor is covered with a tensile-stress-applying insulating film 50 and a compressive-stress-applying insulating film 51, a drive transistor is covered with the tensile-stress-applying insulating film 50. Since these transistors are N-type MIS transistors, application of tensile stress to the channels of these transistors enhances the driving forces thereof, and application of compressive stress thereto decreases the driving forces of these transistors. Since in this embodiment an SRAM drive region SD is covered with the tensile-stress-applying insulating film 50, this enhances the driving force of the drive transistor. On the other hand, since an SRAM access region SA is covered with a layered film of the compressive-stress-applying insulating film 51 and the tensile-stress-applying insulating film 50, tensile stress applied by the tensile-stress-applying insulating film 50 is canceled by compressive stress applied by the compressive-stress-applying insulating film 51. This prevents the driving force of the access transistor from being enhanced as compared with the drive transistor. In view of the above, the access transistor can have a lower driving force than the drive transistor. This can suppress malfunction of an SRAM, resulting in improved noise margin.

In this embodiment, a description was given of the case where an access transistor and a drive transistor are N-type MIS transistors. However, the access transistor and the drive transistor may be P-type MIS transistors. In this case, the access transistor needs to be covered with a layered film of a tensile-stress-applying insulating film and a compressive-stress-applying insulating film, and the drive transistor needs to be covered with only the compressive-stress-applying insulating film. Application of compressive stress to the channel of a P-type MIS transistor enhances the driving force thereof, and application of a tensile stress thereto decreases the driving force of the P-type MIS transistor. In view of the above, also in the case where the access transistor and the drive transistor are P-type MIS transistor, the access transistor can have a lower driving force than the drive transistor.

In this embodiment, for an SRAM access region SA, a compressive-stress-applying insulating film 51 is formed on a tensile-stress-applying insulating film 50. However, a tensile-stress-applying insulating film 50 may be formed on a compressive-stress-applying insulating film 51.

Embodiment 2

Figure 6:
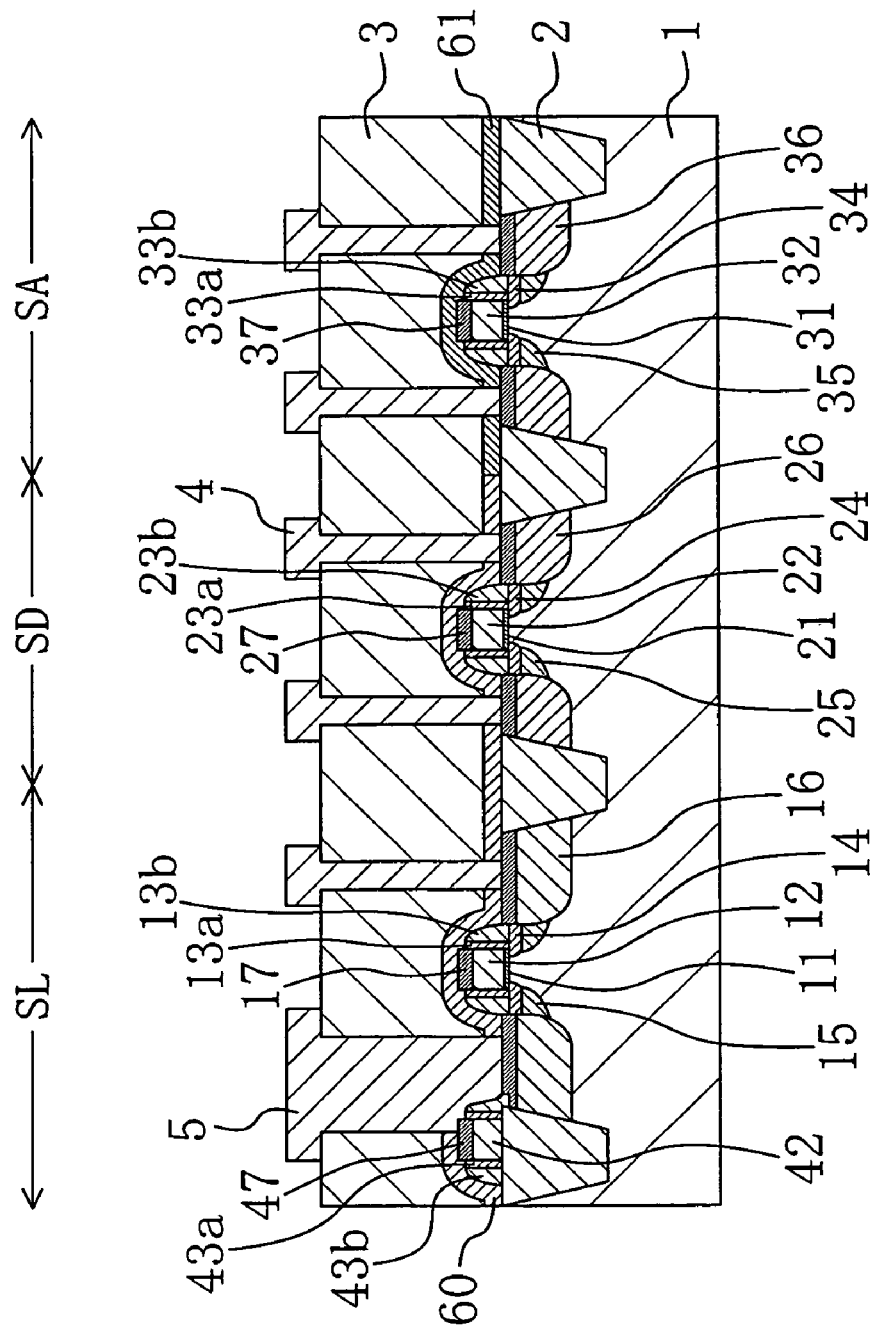
FIG. 6 is a cross-sectional view illustrating the structure of a semiconductor device according to a second embodiment of the present invention.

FIG. 6 is a cross-sectional view illustrating the structure of a semiconductor device according to a second embodiment of the present invention. In the semiconductor device of this embodiment, only a compressive-stress-applying insulating film 61 of silicon nitride generating compressive stress is formed by plasma CVD to cover a gate electrode 32 and N-type source/drain regions 36 for an SRAM access region SA. The semiconductor device of this embodiment has the same structure as that of the first embodiment except for the above-mentioned feature, and thus a detailed description thereof is not given.

Next, a fabrication method for a semiconductor device according to this embodiment will be described with reference to FIGS. 7A through 10B. FIGS. 7A through 10B are cross-sectional views illustrating process steps in the fabrication method for a semiconductor device according to the second embodiment of the present invention.

Figure 7A:
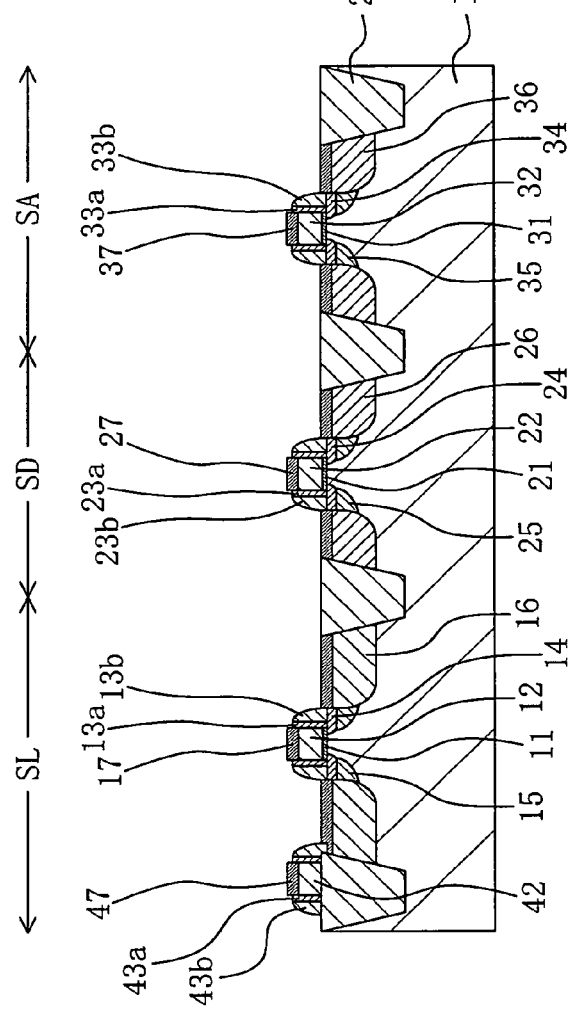
FIGS. 7A and 7B are cross-sectional views illustrating some of process steps in a fabrication method for a semiconductor device according to the second embodiment of the present invention.

In the fabrication method for a semiconductor device of this embodiment, the structure of the semiconductor device illustrated in FIG. 7A is formed after the same process as described in the first embodiment.

Figure 7B:
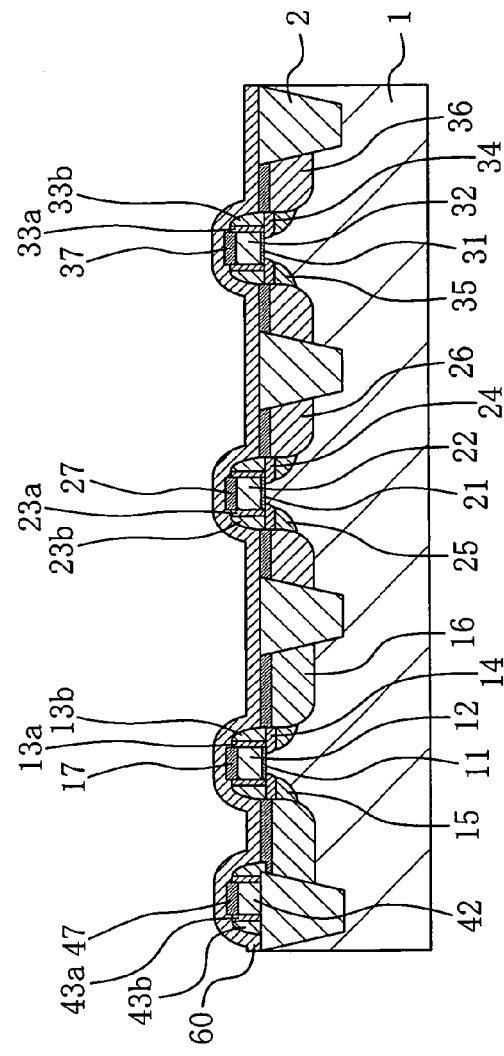

Next, in the process step illustrated in FIG. 7B, a tensile-stress-applying insulating film 60 of silicon nitride generating tensile stress is formed by LP-CVD to cover the entire substrate area.

Figure 8A:
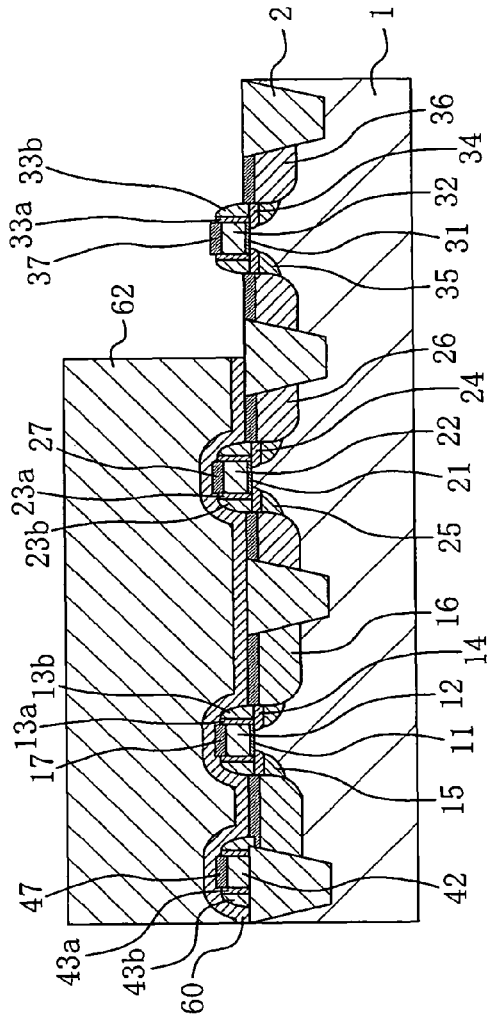
FIGS. 8A and 8B are cross-sectional views illustrating some of the process steps in the fabrication method for a semiconductor device according to the second embodiment of the present invention.

Next, in the process step illustrated in FIG. 8A, a first mask 62 of a resist is formed to cover an SRAM load region SL and SRAM drive region SD of a semiconductor substrate 1 and expose an SRAM access region SA thereof. Thereafter, a portion of the tensile-stress-applying insulating film 60 located on the SRAM access region SA is etched away using the first mask 62 as a mask for etching.

Figure 8B:
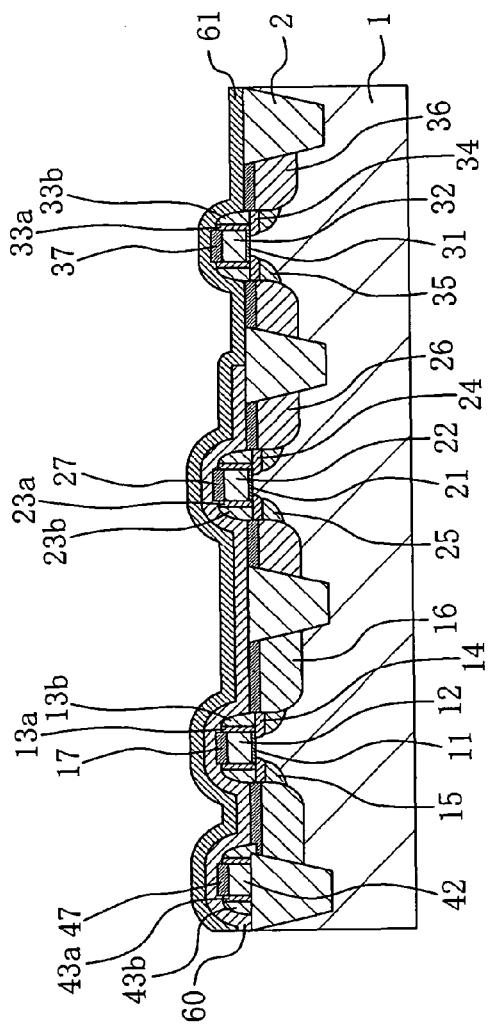

Next, in the process step illustrated in FIG. 8B, the first mask 62 is removed, and then a compressive-stress-applying insulating film 61 of silicon nitride generating compressive stress is formed by plasma CVD to cover the entire substrate area.

Figure 9A:
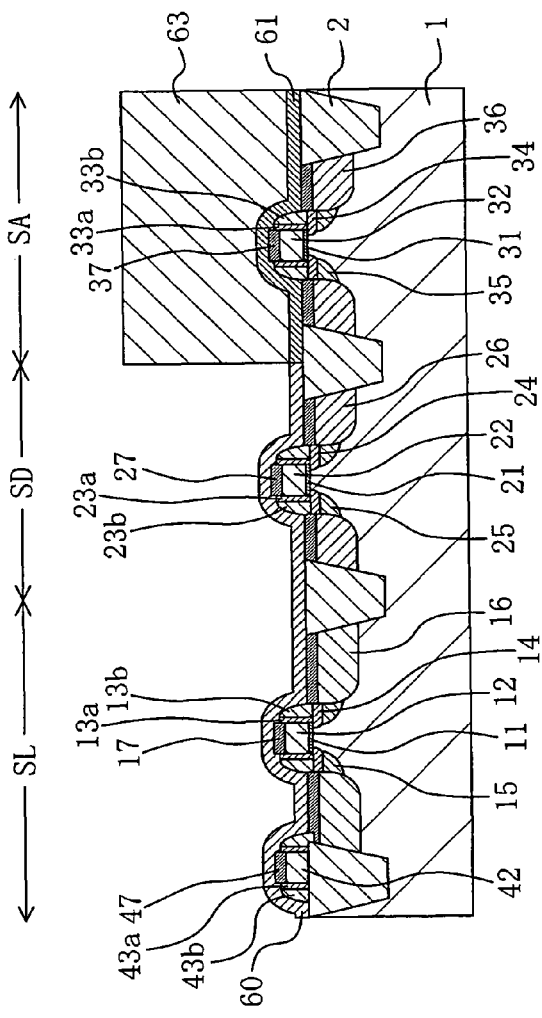
FIGS. 9A and 9B are cross-sectional views illustrating some of the process steps in the fabrication method for a semiconductor device according to the second embodiment of the present invention.

Next, in the process step illustrated in FIG. 9A, a second mask 63 of a resist is formed to cover the SRAM access region SA of the semiconductor substrate 1 and expose the SRAM drive region SD and SRAM load region SL thereof. Thereafter, a portion of the compressive-stress-applying insulating film 61 covering the SRAM drive region SD and the SRAM load region SL is etched away using the second mask 63 as a mask for etching.

Figure 9B:
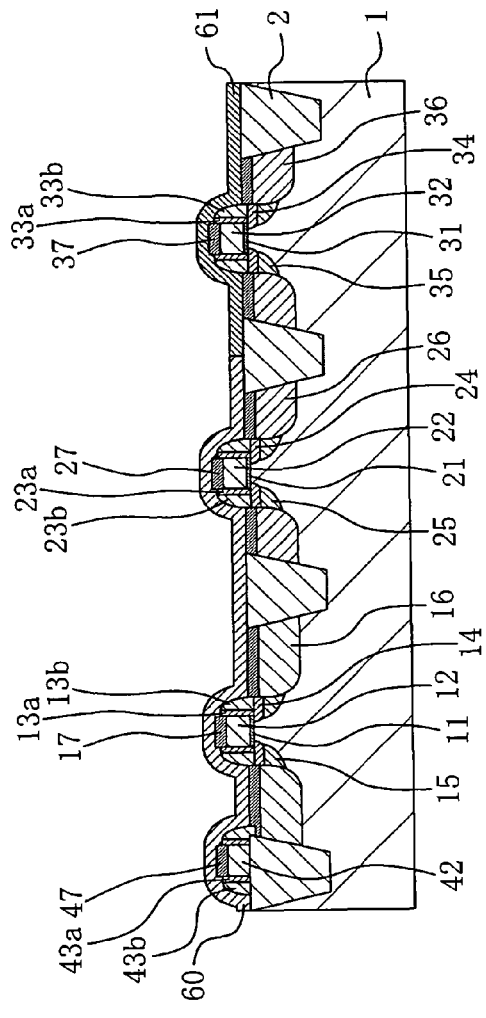

Next, in the process step illustrated in FIG. 9B, the second mask 63 is removed. At this point of time, the compressive-stress-applying insulating film 61 covers the SRAM access region SA. On the other hand, the tensile-stress-applying insulating film 60 covers the SRAM load region SL and the SRAM drive region SD.

Figure 10A:
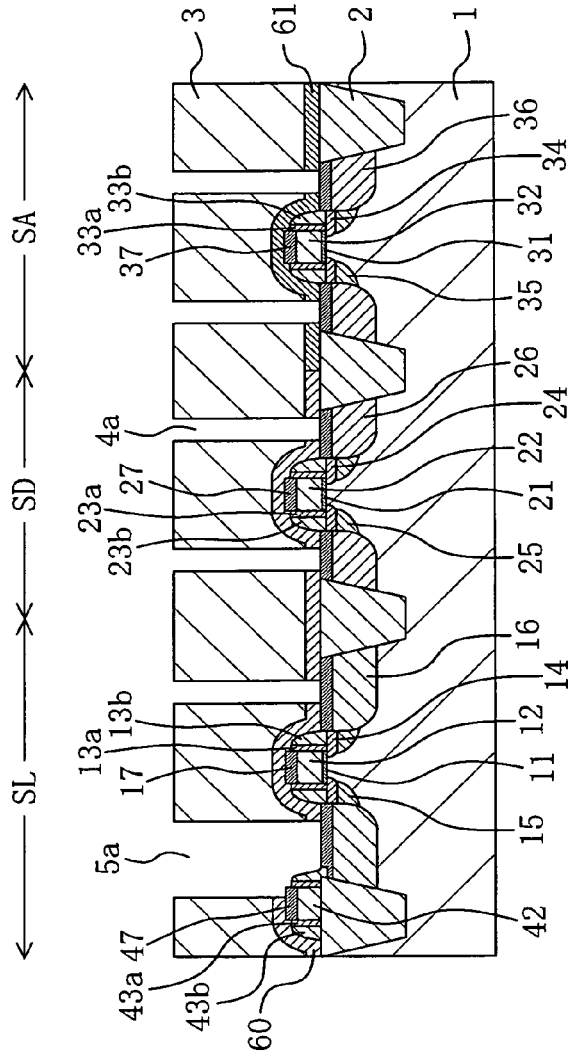
FIGS. 10A and 10B are cross-sectional views illustrating some of the process steps in the fabrication method for a semiconductor device according to the second embodiment of the present invention.

Next, in the process step illustrated in FIG. 10A, an interlayer dielectric 3 of an oxide film is formed to cover the entire substrate area. Thereafter, the interlayer dielectric 3, the compressive-stress-applying insulating film 61 and the tensile-stress-applying insulating film 60 are partially etched away by lithography. In this way, contact holes 4a are formed to reach some of the silicide layers 17, 27 and 37 located in the upper portions of one of the source/drain regions 16 located near the region SD and the source/drain regions 26 and 36. Simultaneously, a shared contact hole 5a is formed astride the border between the SRAM load region SL and the gate interconnect 42 formation region to reach one of the silicide layers 17 located in the upper portion of the other one of the source/drain regions 16 and the silicide layer 47 located in the upper portion of the gate interconnect 42.

Figure 10B:
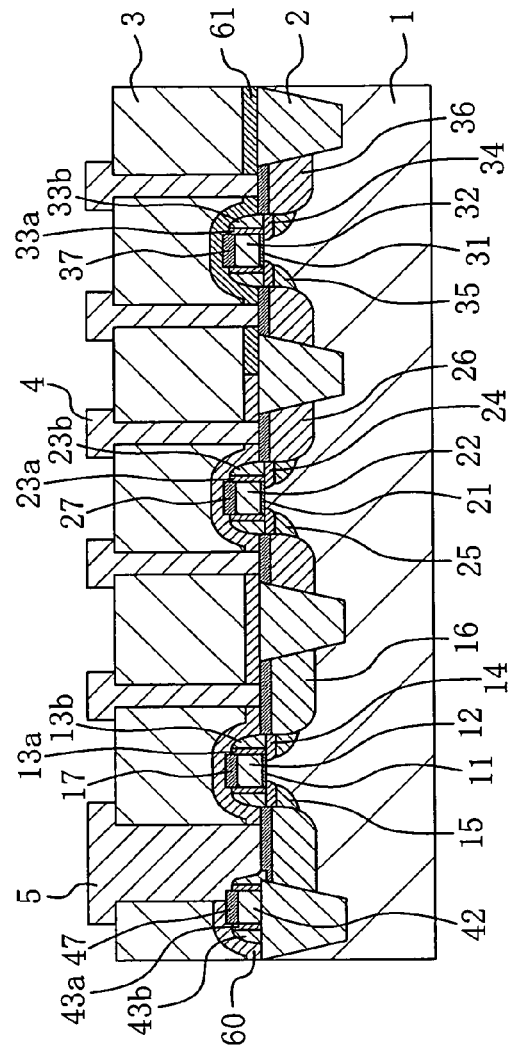

Next, in the process step illustrated in FIG. 10B, buried contacts 4 and a shared contact 5 all made of a barrier film of TiN or any other material and a metal film of tungsten or any other metal are formed to fill the contact holes 4a and the shared contact hole 5a. After the above-mentioned process steps, the semiconductor device of this embodiment is fabricated.

According to the semiconductor device of this embodiment, while an access transistor is covered with a compressive-stress-applying insulating film 61, a drive transistor is covered with a tensile-stress-applying insulating film 60. Since these transistors are N-type MIS transistors, application of tensile stress to the channels of these transistors enhances the driving forces thereof, and application of compressive stress thereto decreases the driving forces of these transistors. In view of the above, the access transistor can have a lower driving force than the drive transistor. This can suppress malfunction of an SRAM, resulting in improved noise margin.

In this embodiment, a description was given of the case where an access transistor and a drive transistor are N-type MIS transistors. However, the access transistor and the drive transistor may be P-type MIS transistors. In this case, the access transistor needs to be covered with a tensile-stress-applying insulating film, and the drive transistor needs to be covered with a compressive-stress-applying insulating film. Application of compressive stress to the channels of the P-type transistors enhances the driving forces thereof, and application of a tensile stress thereto decreases the driving forces of the P-type transistors. In view of the above, also in the case where the access transistor and the drive transistor are P-type MIS transistor, the access transistor can have a lower driving force than the drive transistor.

Embodiment 3

Figure 11:
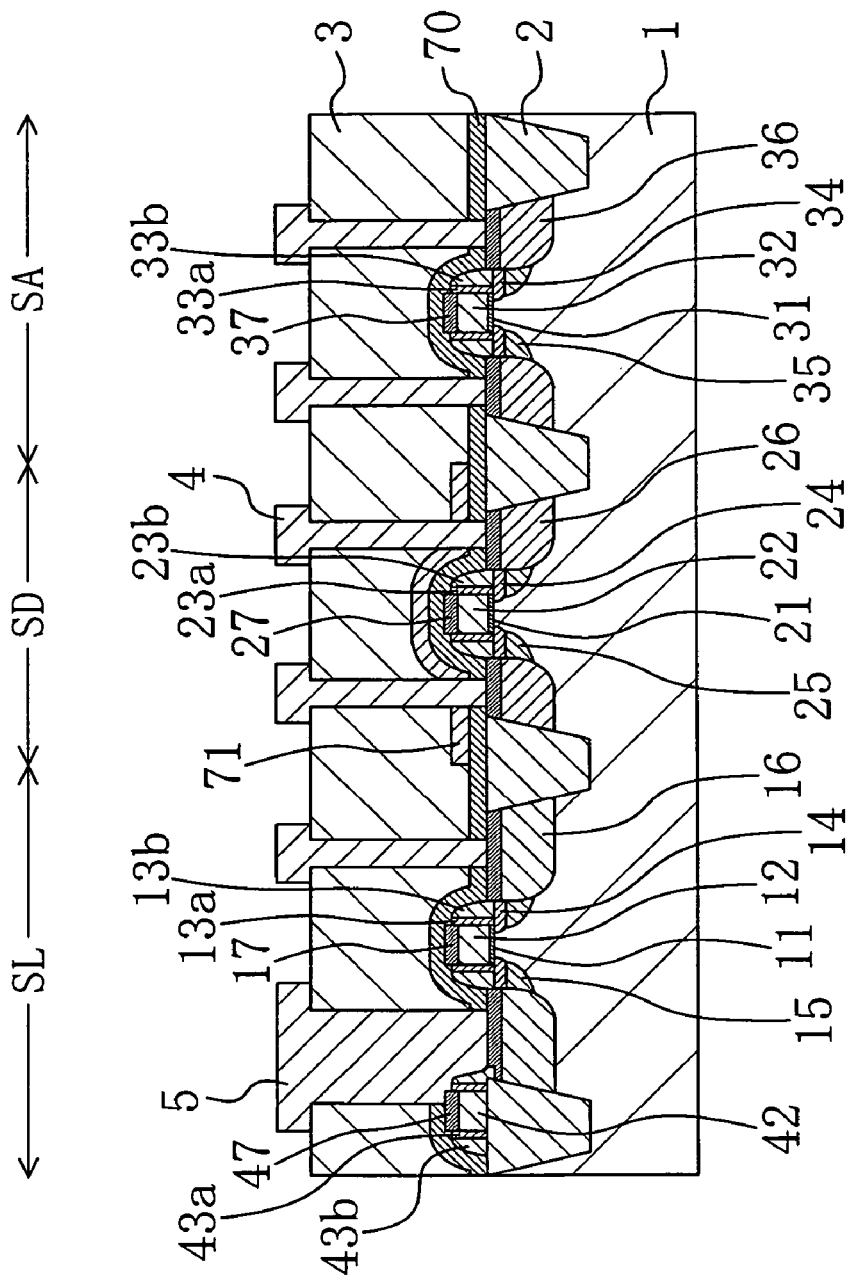
FIG. 11 is a cross-sectional view illustrating the structure of a semiconductor device according to a third embodiment of the present invention.

FIG. 11 is a cross-sectional view illustrating the structure of a semiconductor device according to a third embodiment of the present invention. As illustrated in FIG. 11, a compressive-stress-applying insulating film 70 of silicon nitride generating compressive stress is formed by plasma CVD to cover the entire substrate area. A tensile-stress-applying insulating film 71 of silicon nitride is formed by LP-CVD to cover only a part of the compressive-stress-applying insulating film 70 covering a gate electrode 22 and source/drain regions 26 for an SRAM drive region SD. In view of the above, a layered film of the above-mentioned part of the compressive-stress-applying insulating film 70 and the tensile-stress-applying insulating film 71 is formed to cover only the gate electrode 22 and source/drain regions 26 for the SRAM drive region SD. The semiconductor device of this embodiment has the same structure as that of the first embodiment except for the above-mentioned feature, and thus a detailed description thereof is not given.

A fabrication method for a semiconductor device according to this embodiment will be described with reference to FIGS. 12A through 15B. FIGS. 12A through 15B are cross-sectional views illustrating process steps in the fabrication method for a semiconductor device according to the third embodiment of the present invention.

In the fabrication method for a semiconductor device of this embodiment, the structure of the semiconductor device illustrated in FIG. 12A is formed after the same process as described in the first embodiment.

Next, in the process step illustrated in FIG. 12B, a compressive-stress-applying insulating film 70 of silicon nitride generating compressive stress is formed by plasma CVD to cover the entire substrate area.

Figure 13A:
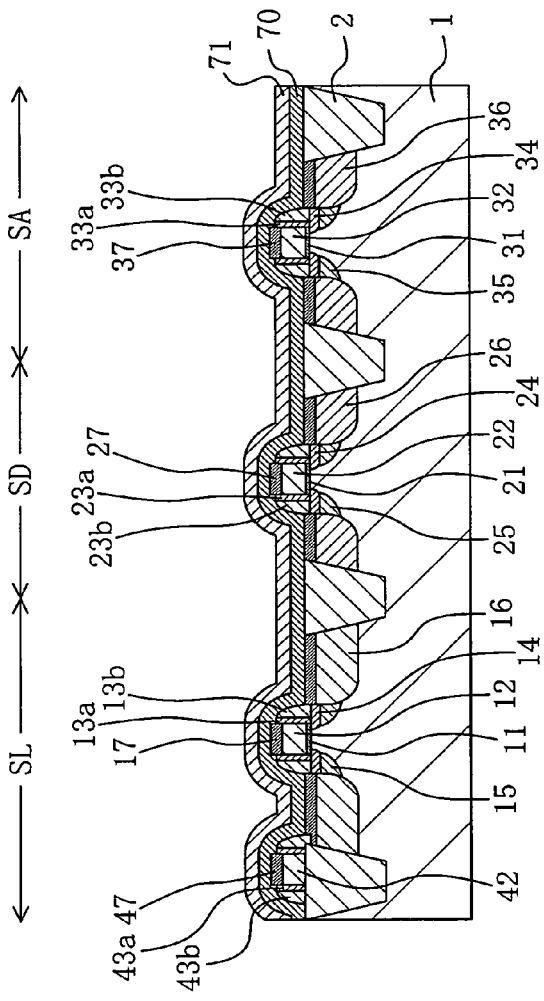
FIGS. 13A and 13B are cross-sectional views illustrating some of the process steps in the fabrication method for a semiconductor device according to the third embodiment of the present invention.

Next, in the process step illustrated in FIG. 13A, a tensile-stress-applying insulating film 71 of silicon nitride generating tensile stress is formed by LP-CVD on the compressive-stress-applying insulating film 70.

Figure 13B:
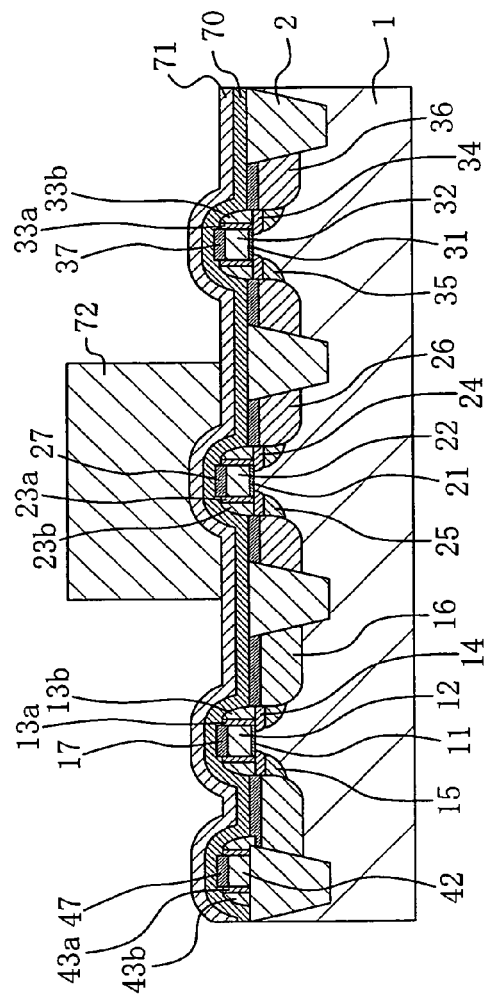

Next, in the process step illustrated in FIG. 13B, a first mask 72 of a resist is formed to cover an SRAM drive region SD and expose an SRAM load region SL and an SRAM access region SA.

Next, in the process step illustrated in FIG. 14A, portions of the tensile-stress-applying insulating film 71 located on the SRAM load region SL and the SRAM access region SA are removed by etching using the first mask 72 as a mask for etching.

Next, in the process step illustrated in FIG. 14B, the first mask 72 is removed. At this point of time, parts of the compressive-stress-applying insulating film 70 exist on the SRAM load region SL and the SRAM access region SA. On the other hand, a layered film of a part of the compressive-stress-applying insulating film 70 and the tensile-stress-applying insulating film 71 exist on the SRAM drive region SD.

Figure 15A:
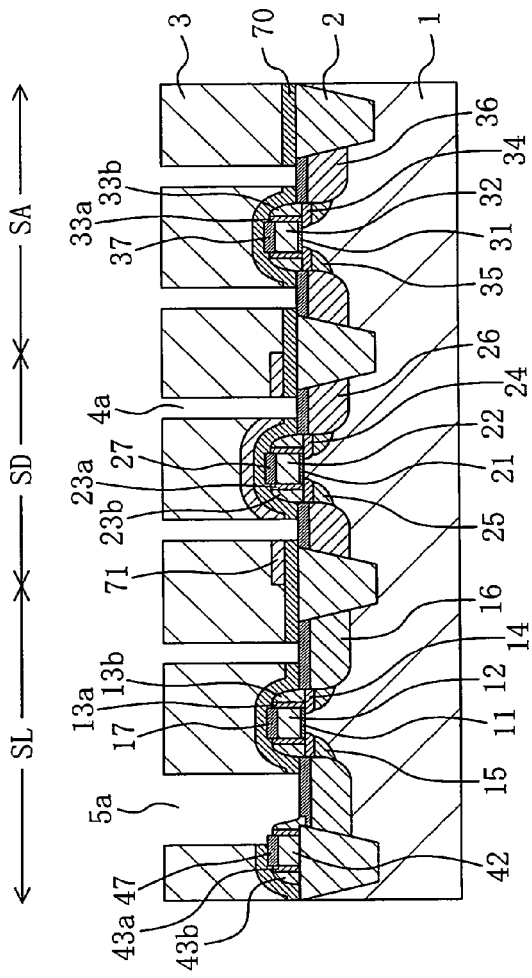
FIGS. 15A and 15B are cross-sectional views illustrating some of the process steps in the fabrication method for a semiconductor device according to the third embodiment of the present invention.

Next, in the process step illustrated in FIG. 15A, an interlayer dielectric 3 of an oxide film is formed to cover the entire substrate area. Thereafter, the interlayer dielectric 3, the tensile-stress-applying insulating film 71 and the compressive-stress-applying insulating film 70 are partially etched away by lithography. In this way, contact holes 4a are formed to reach some of the silicide layers 17, 27 and 37 located in the upper portions of the source/drain regions 16, 26 and 36 except for one of the source/drain regions 16 adjacent to a gate interconnect 42 formation region. Simultaneously, a shared contact hole 5a is formed astride the border between the SRAM load region SL and the gate interconnect 42 formation region to reach one of the silicide layers 17 located in the upper portion of the one of the source/drain regions 16 adjacent to the gate interconnect 42 formation region and the silicide layer 47 located in the upper portion of the gate interconnect 42.

Figure 15B:
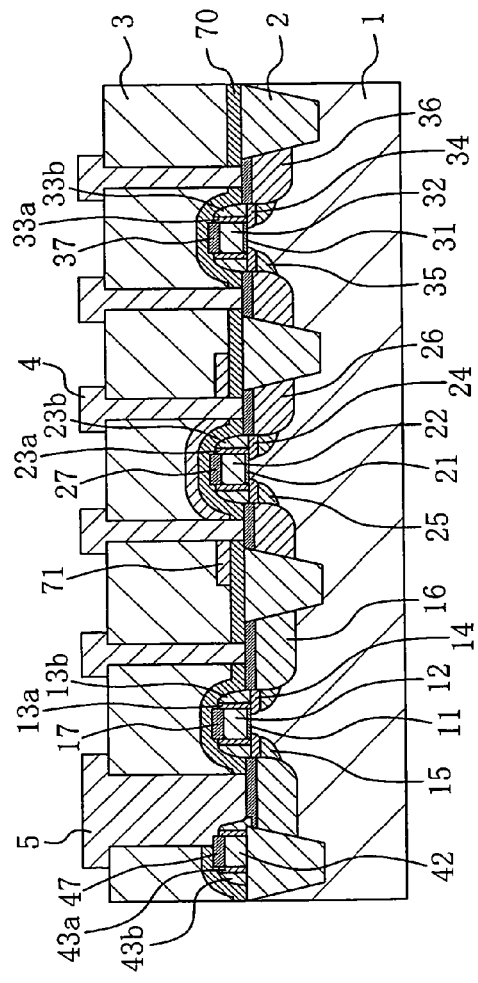

Next, in the process step illustrated in FIG. 15B, buried contacts 4 and a shared contact 5 all made of a barrier film of TiN or any other material and a metal film of tungsten or any other metal are formed to fill the contact holes 4a and the shared contact hole 5a. After the above-mentioned process steps, the semiconductor device of this embodiment is fabricated.

According to the semiconductor device of this embodiment, while an access transistor is covered with a compressive-stress-applying insulating film 70, a drive transistor is covered with the compressive-stress-applying insulating film 70 and a tensile-stress-applying insulating film 71. Since these transistors are N-type MIS transistors, application of tensile stress to the channels of these transistors enhances the driving forces thereof, and application of compressive stress thereto decreases the driving forces of these transistors. Since in this embodiment an SRAM access region SA is covered with the compressive-stress-applying insulating film 70, this decreases the driving force of the access transistor. On the other hand, since an SRAM drive region SD is covered with a layered film of the compressive-stress-applying insulating film 70 and the tensile-stress-applying insulating film 71, the compressive stress caused by the compressive-stress-applying insulating film 70 is canceled by the tensile stress caused by the tensile-stress-applying insulating film 71. This restrains the driving force of the drive transistor from decreasing as compared with the access transistor. In view of the above, the access transistor can have a lower driving force than the drive transistor. This can suppress malfunction of an SRAM, resulting in improved noise margin.

In this embodiment, a load transistor is covered with the compressive-stress-applying insulating film 70. Since the load transistor is a P-type MIS transistor, application of tensile stress to the channel of the load transistor decreases the driving force thereof, and application of compressive stress thereto enhances the driving force of the load transistor. In view of the above, in this embodiment, the driving force of the load transistor can be enhanced.

In this embodiment, a description was given of the case where an access transistor and a drive transistor are N-type MIS transistors. However, the access transistor and the drive transistor may be P-type MIS transistors. In this case, the access transistor needs to be covered with a tensile-stress-applying insulating film, and the drive transistor needs to be covered with both the tensile-stress-applying insulating film and a compressive-stress-applying insulating film. For P-type transistors, application of compressive stress to the channels enhances the driving forces of the P-type transistors, and application of tensile stress thereto decreases the driving forces of the P-type transistors. In view of the above, also in the case where the access transistor and the drive transistor are P-type MIS transistor, the access transistor can have a lower driving force than the drive transistor.

Embodiment 4

Figure 16:
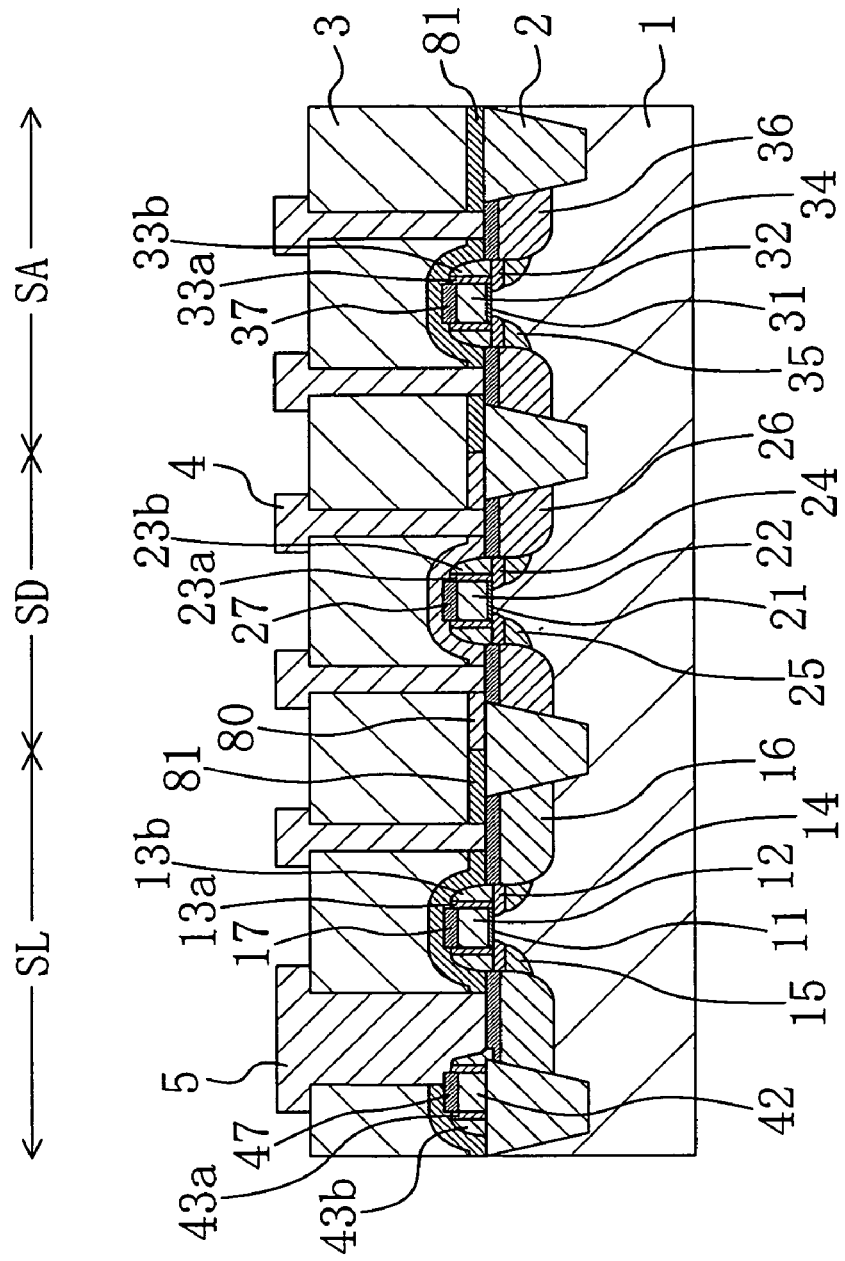
FIG. 16 is a cross-sectional view illustrating the structure of a semiconductor device according to a fourth embodiment of the present invention.

FIG. 16 is a cross-sectional view illustrating the structure of a semiconductor device according to a fourth embodiment of the present invention. In the semiconductor device of this embodiment, a gate electrode 12 and source/drain regions 16 for an SRAM load region SL and a gate electrode 32 and source/drain regions 36 for an SRAM access region SA are covered with a compressive-stress-applying insulating film 81. A gate electrode 22 and source/drain regions 26 for an SRAM drive region SD are covered with a tensile-stress-applying insulating film 80. The semiconductor device of this embodiment has the same structure as that of the first embodiment except for the above-mentioned feature, and thus a detailed description thereof is not given.

Next, a fabrication method for a semiconductor device according to this embodiment will be described with reference to FIGS. 17A through 20B. FIGS. 17A through 20B are cross-sectional views illustrating process steps in the fabrication method for a semiconductor device according to the fourth embodiment of the present invention.

Figure 17A:
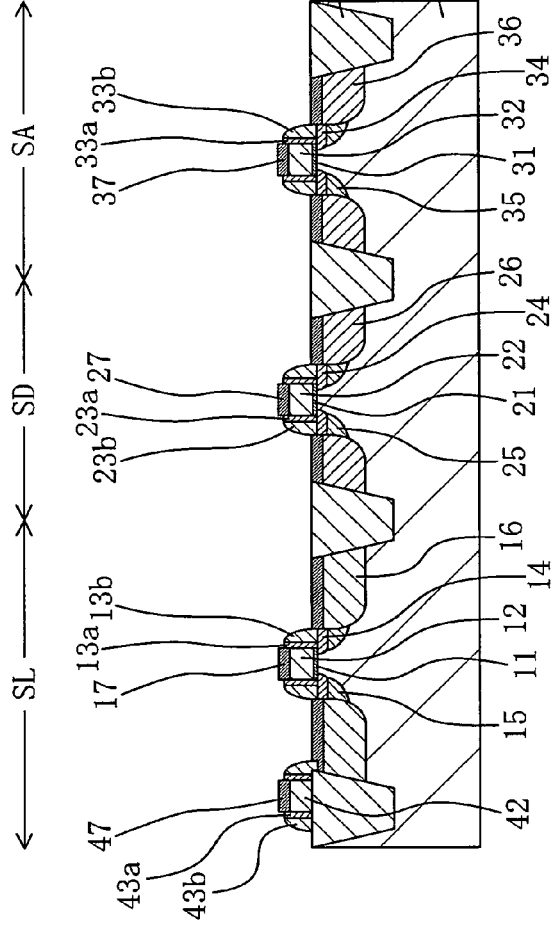
FIGS. 17A and 17B are cross-sectional views illustrating some of process steps in a fabrication method for a semiconductor device according to the fourth embodiment of the present invention.

In the fabrication method for a semiconductor device of this embodiment, the structure of the semiconductor device illustrated in FIG. 17A is formed after the same process as described in the first embodiment.

Figure 17B:
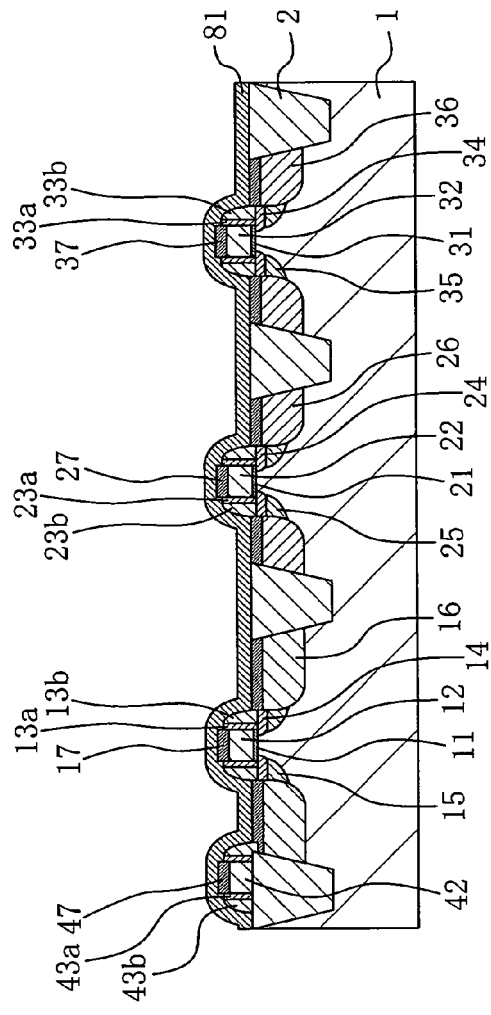

Next, in the process step illustrated in FIG. 17B, a compressive-stress-applying insulating film 81 of silicon nitride generating compressive stress is formed by plasma CVD to cover the entire substrate area.

Figure 18A:
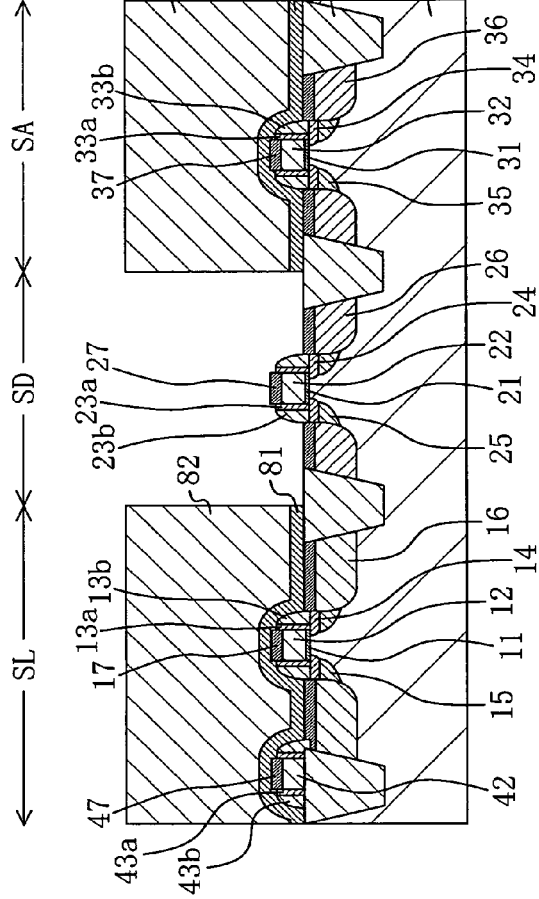
FIGS. 18A and 18B are cross-sectional views illustrating some of the process steps in the fabrication method for a semiconductor device according to the fourth embodiment of the present invention.

Next, in the process step illustrated in FIG. 18A, a first mask 82 of a resist is formed to cover an SRAM load region SL and SRAM access region SA of a semiconductor substrate 1 and expose an SRAM drive region SD thereof. Thereafter, a portion of the compressive-stress-applying insulating film 81 located on the SRAM drive region SD is etched away using the first mask 82 as a mask for etching.

Figure 18B:
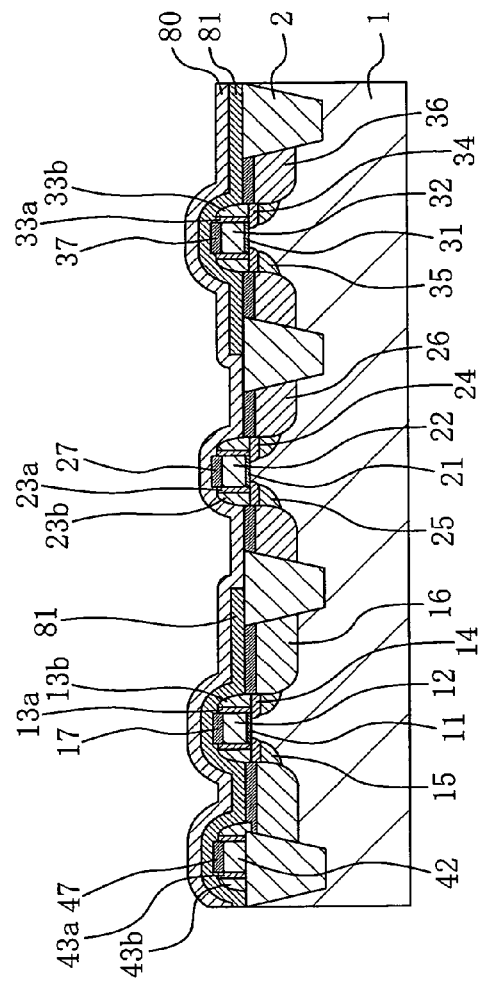

Next, in the process step illustrated in FIG. 18B, the first mask 82 is removed, and then a tensile-stress-applying insulating film 80 of silicon nitride generating tensile stress is formed by LP-CVD to cover the entire substrate area.

Figure 19A:
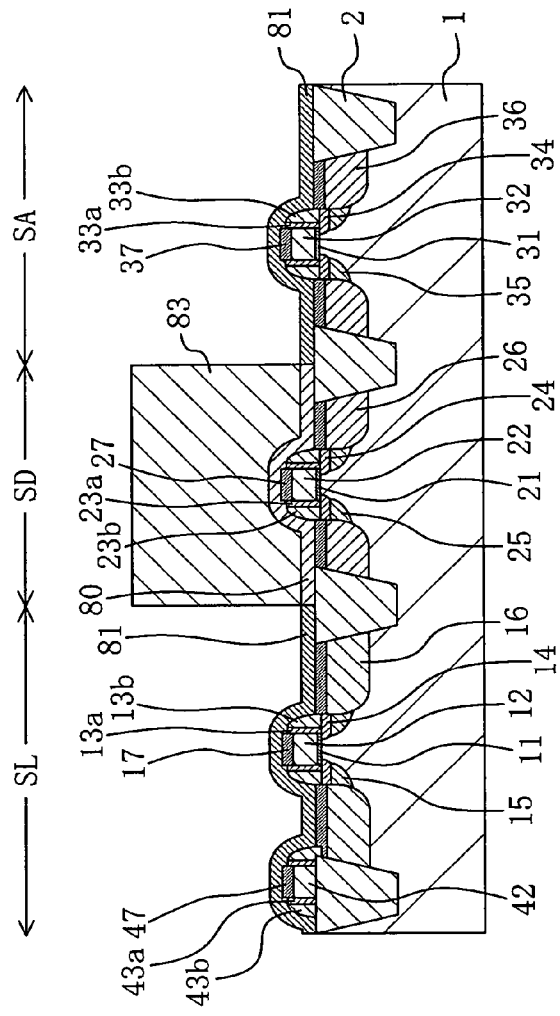
FIGS. 19A and 19B are cross-sectional views illustrating some of the process steps in the fabrication method for a semiconductor device according to the fourth embodiment of the present invention.

Next, in the process step illustrated in FIG. 19A, a second mask 83 of a resist is formed to cover the SRAM drive region SD and expose the SRAM load region SL and the SRAM access region SA. Thereafter, portions of the tensile-stress-applying insulating film 80 located on the SRAM load region SL and the SRAM access region SA are etched away using the second mask 83 as a mask for etching.

Figure 19B:
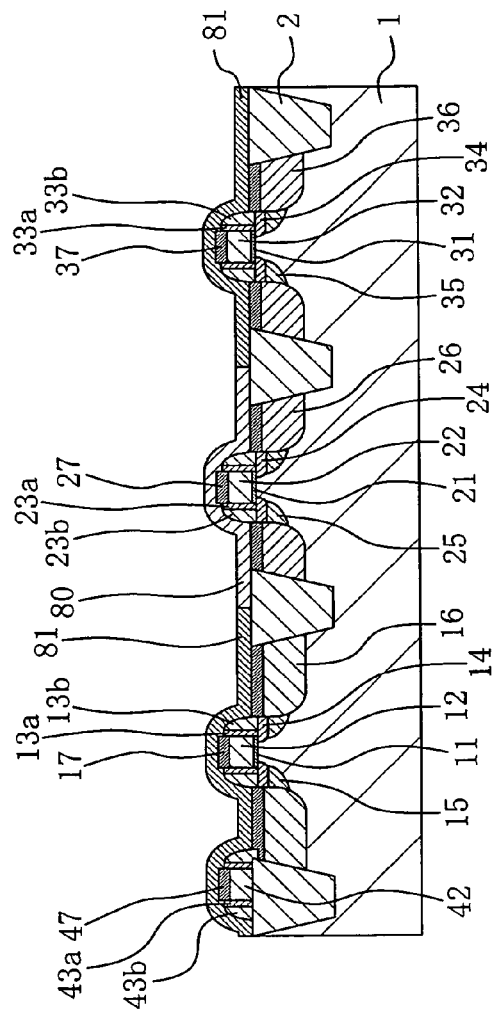

Next, in the process step illustrated in FIG. 19B, the second mask 83 is removed. At this point of time, the compressive-stress-applying insulating film 81 covers the SRAM load region SL and the SRAM access region SA, and the tensile-stress-applying insulating film 80 covers the SRAM drive region SD.

Figure 20A:
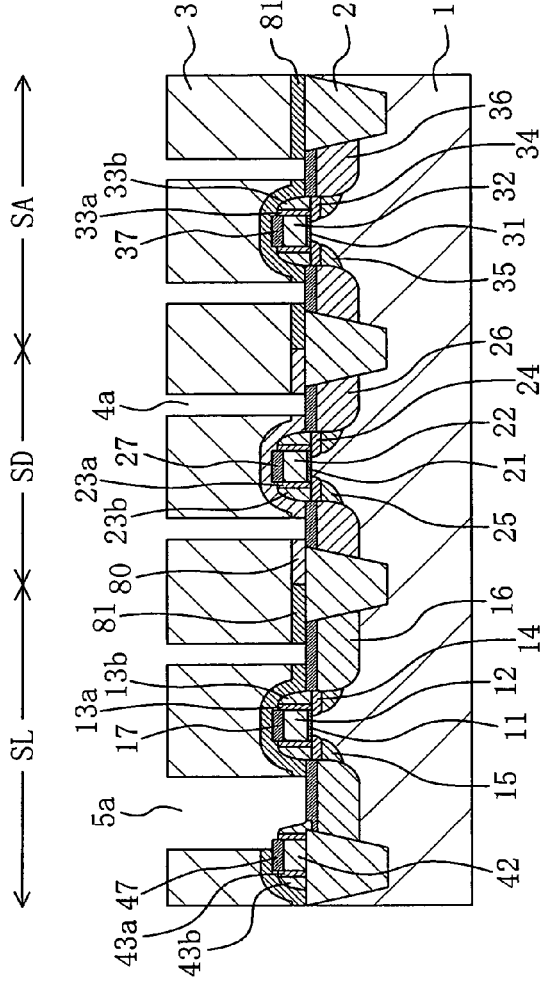
FIGS. 20A and 20B are cross-sectional views illustrating some of the process steps in the fabrication method for a semiconductor device according to the fourth embodiment of the present invention.

Next, in the process step illustrated in FIG. 20A, an interlayer dielectric 3 of an oxide film is formed to cover the entire substrate area. Thereafter, the interlayer dielectric 3, the tensile-stress-applying insulating film 80 and the compressive-stress-applying insulating film 81 are partially etched away by lithography. In this way, contact holes 4a are formed to reach some of the silicide layers 17, 27 and 37 located in the upper portions of the source/drain regions 16, 26 and 36 except for one of the source/drain regions 16 adjacent to a gate interconnect 42 formation region. Simultaneously, a shared contact hole 5a is formed astride the border between the SRAM load region SL and the gate interconnect 42 formation region to reach one of the silicide layers 17 located in the upper portion of the one of the source/drain regions 16 adjacent to the gate interconnect 42 formation region and the silicide layer 47 located in the upper portion of the gate interconnect 42.

Figure 20B:
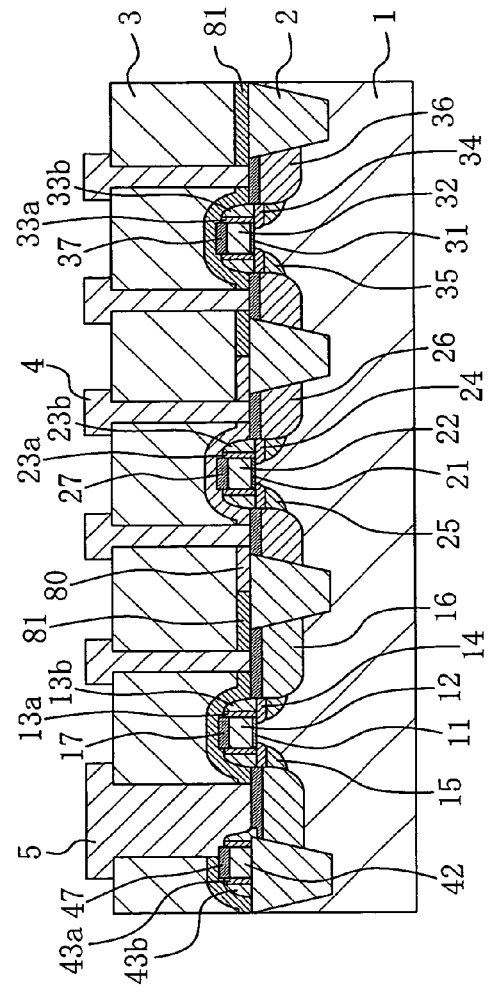

Next, in the process step illustrated in FIG. 20B, buried contacts 4 and a shared contact 5 made of a barrier film of TiN or any other material and a metal film of tungsten or any other metal are formed to fill the contact holes 4a and the shared contact hole 5a. After the above-mentioned process steps, the semiconductor device of this embodiment is fabricated.

According to the semiconductor device of this embodiment, while an access transistor is covered with a compressive-stress-applying insulating film 81, a drive transistor is covered with a tensile-stress-applying insulating film 80. Since these transistors are N-type MIS transistors, application of tensile stress to the channels of these transistors enhances the driving forces thereof, and application of compressive stress thereto decreases the driving forces of these transistors. In view of the above, the access transistor can have a lower driving force than the drive transistor. This can suppress malfunction of an SRAM, resulting in improved noise margin.

In this embodiment, a load transistor is covered with the compressive-stress-applying insulating film 81. Since the load transistor is a P-type MIS transistor, application of tensile stress to the channel of the load transistor decreases the driving force thereof, and application of compressive stress thereto enhances the driving force of the load transistor. In view of the above, in this embodiment, the driving force of the load transistor can also be enhanced.

In this embodiment, a description was given of the case where an access transistor and a drive transistor are N-type MIS transistors. However, the access transistor and the drive transistor may be P-type MIS transistors. In this case, the access transistor needs to be covered with a layered film of a tensile-stress-applying insulating film and a compressive-stress-applying insulating film, and the drive transistor needs to be covered with only the compressive-stress-applying insulating film. For P-type transistors, application of compressive stress to the channels enhances the driving forces of the P-type transistors, and application of tensile stress thereto decreases the driving forces of the P-type transistors. In view of the above, also in the case where the access transistor and the drive transistor are P-type MIS transistor, the access transistor can have a lower driving force than the drive transistor.

Embodiment 5

Figure 21:
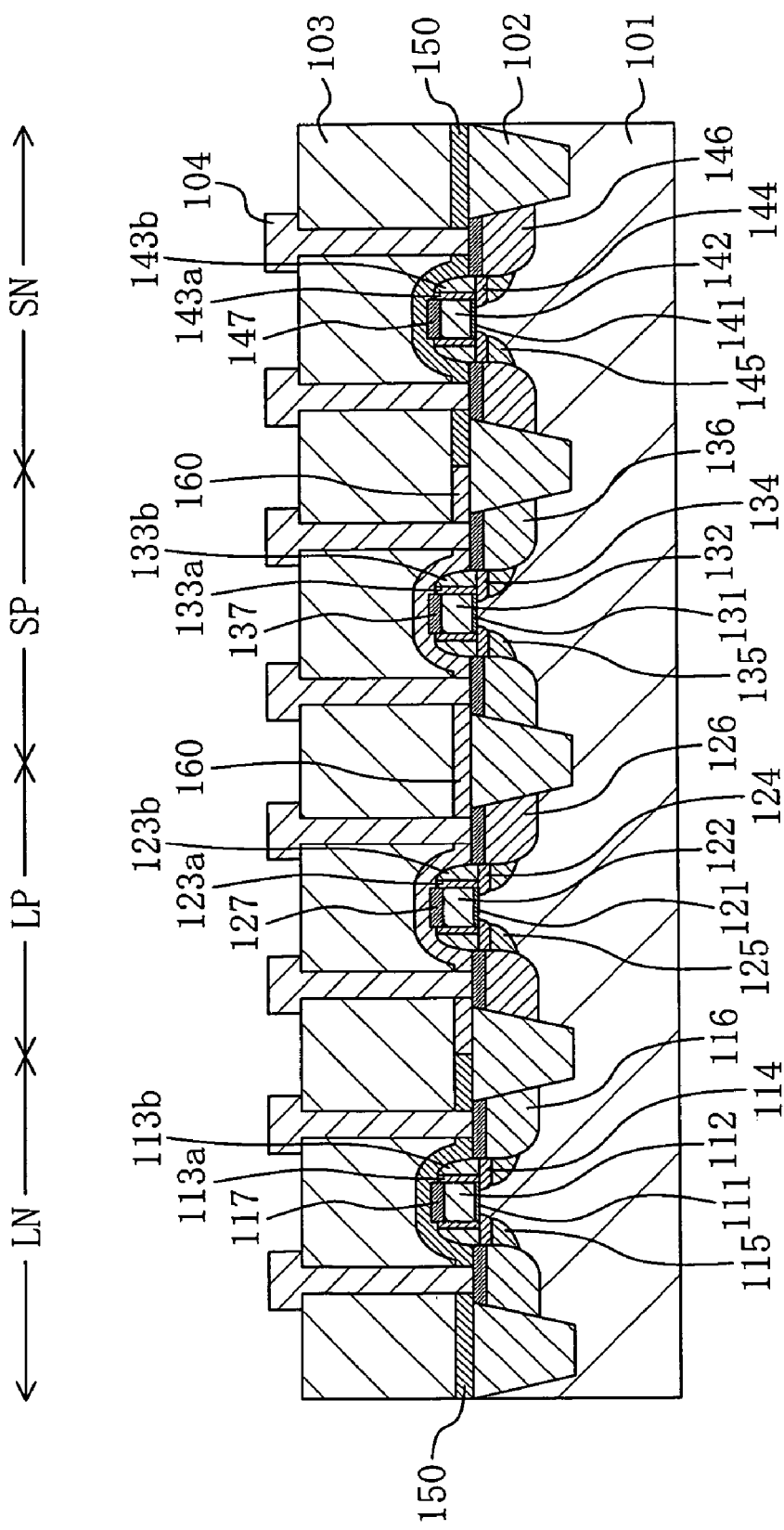
FIG. 21 is a cross-sectional view illustrating the structure of a semiconductor device according to a fifth embodiment of the present invention.

FIG. 21 is a cross-sectional view illustrating the structure of a semiconductor device according to a fifth embodiment of the present invention. As illustrated in FIG. 21, in the semiconductor device of this embodiment, a semiconductor substrate 101 is sectioned into an N-type logic region LN at which an N-channel MIS transistor for logic is formed, a P-type logic region LP at which a P-channel MIS transistor for the logic is formed, a P-type SRAM region SP at which a P-channel MIS transistor for an SRAM is formed, and an N-type SRAM region SN at which an N-channel MIS transistor for the SRAM is formed. The regions LN, LP, SP, and SN are electrically isolated from one another by a shallow trench isolation region 2.

A gate electrode 112 is formed on the N-type logic region LN of the semiconductor substrate 101 with a gate insulating film 111 interposed therebetween. Offset sidewalls 113a and sidewalls 113b are formed on the side surfaces of the gate electrode 112, and the sidewalls 113b are located further from the gate electrode 112 than the offset sidewalls 113a. N-type extension regions 114 are formed in regions of the semiconductor substrate 101 located under the offset sidewalls 113a and the sidewalls 113b. P-type pocket regions 115 are formed in regions of the semiconductor substrate 101 located under the N-type extension regions 114. N-type source/drain regions 116 are formed in regions of the semiconductor substrate 101 located further from the gate electrode 112 than the sidewalls 113b. Silicide layers 117 are formed in the upper portion of the gate electrode 112 and the upper portions of the N-type source/drain regions 116.

For the N-type logic region LN, a tensile-stress-applying insulating film 150 of silicon nitride is formed by LP-CVD to cover the gate electrode 112, the offset sidewalls 113a, sidewalls 113b, and N-type source/drain regions 116.

A gate electrode 122 is formed on the P-type logic region LP of the semiconductor substrate 101 with a gate insulating film 121 interposed therebetween. Offset sidewalls 123a and sidewalls 123b are formed on the side surfaces of the gate electrode 122, and the sidewalls 123b are located further from the gate electrode 122 than the offset sidewalls 123a. P-type extension regions 124 are formed in regions of the semiconductor substrate 101 located under the offset sidewalls 123a and the sidewalls 123b. N-type pocket regions 125 are formed in regions of the semiconductor substrate 101 located under the P-type extension regions 124. P-type source/drain regions 126 are formed in regions of the semiconductor substrate 101 located further from the gate electrode 122 than the sidewalls 123b. Silicide layers 127 are formed in the upper portion of the gate electrode 122 and the upper portions of the P-type source/drain regions 126.

For the P-type logic region LP, a compressive-stress-applying insulating film 160 of silicon nitride is formed by plasma CVD to cover the gate electrode 122, the offset sidewalls 123a, the sidewalls 123b, and the P-type source/drain regions 126.

A gate electrode 132 is formed on the P-type SRAM region SP of the semiconductor substrate 101 with a gate insulating film 131 interposed therebetween. Offset sidewalls 133a and sidewalls 133b are formed on the side surfaces of the gate electrode 132, and the sidewalls 133b are located further from the gate electrode 132 than the offset sidewalls 133a. P-type extension regions 134 are formed in regions of the semiconductor substrate 101 located under the offset sidewalls 133a and the sidewalls 133b. N-type pocket regions 135 are formed in regions of the semiconductor substrate 101 located under the P-type extension regions 134. P-type source/drain regions 136 are formed in regions of the semiconductor substrate 101 located further from the gate electrode 132 than the sidewalls 133b. Silicide layers 137 are formed in the upper portion of the gate electrode 132 and the upper portions of the P-type source/drain regions 136.

For the P-type SRAM region SP, the compressive-stress-applying insulating film 160 of silicon nitride is formed by plasma CVD to cover the gate electrode 132, the offset sidewalls 133a, the sidewalls 133b, and the P-type source/drain regions 136.

A gate electrode 142 is formed on the N-type SRAM region SN of the semiconductor substrate 101 with a gate insulating film 141 interposed therebetween. Offset sidewalls 143a and sidewalls 143b are formed on the side surfaces of the gate electrode 142, and the sidewalls 143b are located further from the gate electrode 142 than the offset sidewalls 143a. N-type extension regions 144 are formed in regions of the semiconductor substrate 101 located under the offset sidewalls 143a and the sidewalls 143b. P-type pocket regions 145 are formed in regions of the semiconductor substrate 101 located under the N-type extension regions 144. N-type source/drain regions 146 are formed in regions of the semiconductor substrate 101 located further from the gate electrode 142 than the sidewalls 143b. Silicide layers 147 are formed in the upper portion of the gate electrode 142 and the upper portions of the N-type source/drain regions 146.

For the N-type SRAM region SN, the tensile-stress-applying insulating film 150 of silicon nitride is formed by LP-CVD to cover the gate electrode 142, the offset sidewalls 143a, the sidewalls 143b, and the N-type source/drain regions 146.

The tensile-stress-applying insulating film 150 located on the regions LN and SN and the compressive-stress-applying insulating film 151 located on the regions LP and SP are covered with an interlayer dielectric 103. Contacts 104 are formed to pass through the interlayer dielectric 103 and the tensile-stress-applying insulating film 150 or the compressive-stress-applying insulating film 160 and reach some of the silicide layers 117, 127, 137, and 147 located in the upper portions of the source/drain regions 116, 126, 136, and 146.

Next, a fabrication method for a semiconductor device according to this embodiment will be described with reference to FIGS. 22A through 26B. FIGS. 22A through 26B are cross-sectional views illustrating process steps in the fabrication method for a semiconductor device according to the fifth embodiment of the present invention.

Figure 22A:
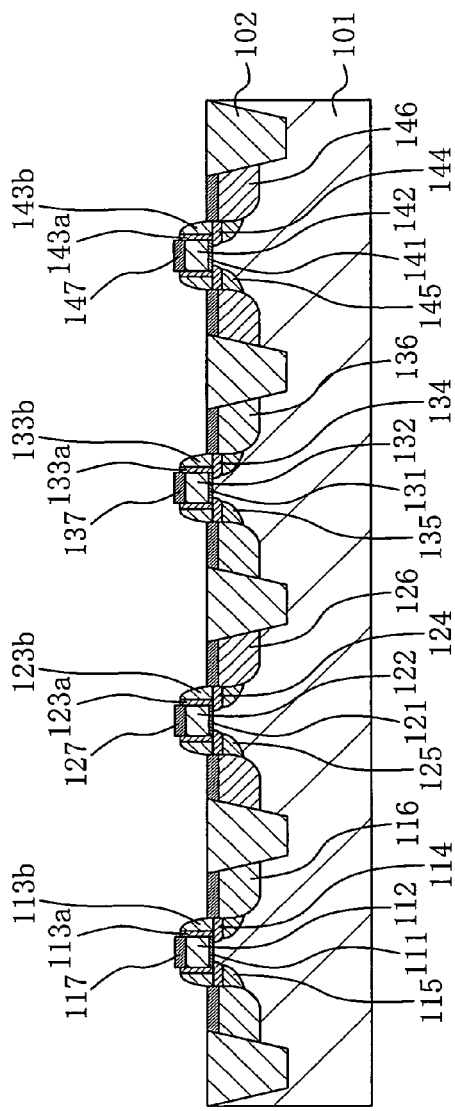
FIGS. 22A and 22B are cross-sectional views illustrating some of process steps in a fabrication method for a semiconductor device according to the fifth embodiment of the present invention.

In the fabrication method of this embodiment, the following process steps are carried out to provide the structure of the semiconductor device illustrated in FIG. 22A. Active regions of a semiconductor substrate 101, i.e., an N-type logic region LN, a P-type logic region LP, a P-type SRAM region SP, and an N-type SRAM region SN, are defined by a shallow trench isolation region 102 formed in the semiconductor substrate 101. A gate insulating film 111 and a gate electrode 112 are formed on the N-type logic region LN. A gate insulating film 121 and a gate electrode 122 are formed on the P-type logic region LP. A gate insulating film 131 and a gate electrode 132 are formed on the P-type SRAM region SP. A gate insulating film 141 and a gate electrode 142 are formed on the N-type SRAM region SN. Next, offset sidewalls 113a, 123a, 133a, and 143a are formed on the side surfaces of the gate electrodes 112, 122, 132, and 142, respectively.

Subsequently, for example, arsenic ions serving as an N-type impurity are implanted into the N-type logic region LN and the N-type SRAM region SN at an acceleration energy of 3 KeV, a dose of $1.5 \times 10^{15}/cm^2$ and a tilt angle of 0 degree. In this way, N-type extension regions 114 and 144 are formed in the regions LN and SN. Next, for example, boron ions serving as a P-type impurity are implanted into the regions LN and SN at an acceleration energy of 10 KeV, a dose of $8.0 \times 10^{12}/cm^2$ and a tilt angle of 25 degrees from four directions by rotating the wafer. In this way, P-type pocket regions 115 and 145 are formed in the regions LN and SN to cover the bottoms of the N-type extension regions 114 and 144.

Next, for example, boron ions serving as a P-type impurity are implanted into the P-type logic region LP and the P-type SRAM region SP at an acceleration energy of 0.5 KeV, a dose of $3.0 \times 10^{14}/cm^2$ and a tilt angle of 0 degree. In this way, P-type extension regions 124 and 134 are formed in the regions LP and SP. Next, for example, phosphorus ions serving as an N-type impurity are implanted into the regions LP and SP at an acceleration energy of 30 KeV, a dose of $7.0 \times 10^{12}/cm^2$ and a tilt angle of 25 degrees from four directions by rotating the wafer. In this way, N-type pocket regions 125 and 135 are formed in the regions LP and SP to cover the bottoms of the P-type extension regions 124 and 134.

Next, a silicon nitride film is formed by LP-CVD to cover the entire substrate area and then partially etched away by an etch-back process. Sidewalls 113b, 123b, 133b, and 143b are formed on the side surfaces of the gate electrodes 112, 122, 132, and 142 with the offset sidewalls 113a, 123a, 133a, and 143a interposed therebetween, respectively. Thereafter, for example, arsenic ions serving as an N-type impurity are implanted into the N-type logic region LN and the N-type SRAM region SN at an acceleration energy of 20 KeV, a dose of $4.0\times10^{15}/cm^2$ and a tilt angle of 0 degree. Subsequently, for example, phosphorus ions serving as an N-type impurity are implanted into the regions LN and SN at an acceleration energy of 10 KeV, a dose of $1.0\times10^{15}/cm^2$ and a tilt angle of 7 degrees. In this way, N-type source/drain regions 116 and 146 are formed in the regions LN and SN.

Next, for example, boron ions serving as a P-type impurity are implanted into the P-type logic region LP and the P-type SRAM region SP at an acceleration energy of 2 KeV, a dose of $4.0\times10^{15}/cm^2$ and a tilt angle of 7 degrees. In this way, P-type source/drain regions 126 and 136 are formed in the regions LP and SP.

Silicide layers 117, 127, 137, and 147 are selectively formed, using a salicide technology, in the upper portions of the gate electrodes 112, 122, 132, and 142 and the upper portions of the source/drain regions 116, 126, 136, and 146, respectively.

Figure 22B:
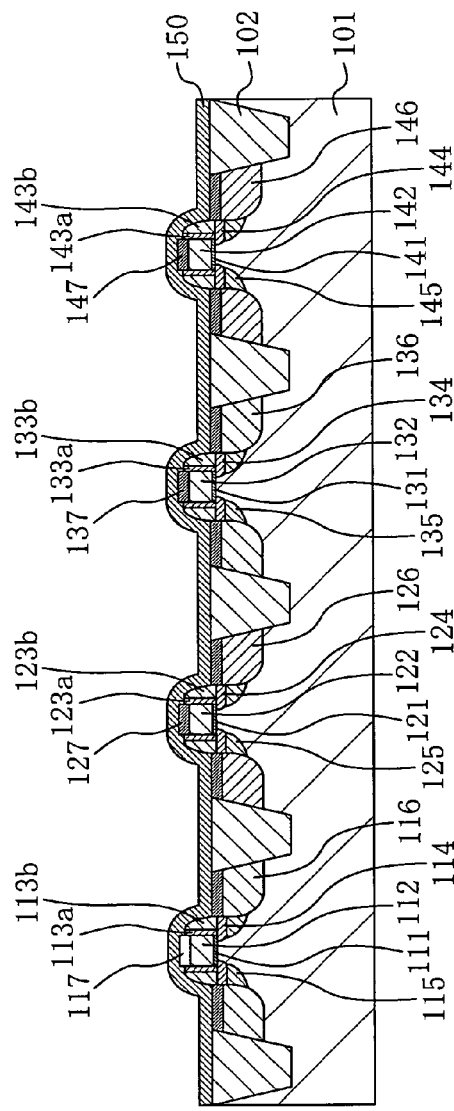

Next, in the process step illustrated in FIG. 22B, a tensile-stress-applying insulating film 150 of silicon nitride generating tensile stress is formed by LP-CVD to cover the entire substrate area.

Next, in the process step illustrated in FIG. 23A, a first mask 152 of a resist is formed to cover the N-type logic region LN and N-type SRAM region SN of the semiconductor substrate 101 and expose the P-type SRAM region SP and P-type logic region LP thereof. Thereafter, a portion of the tensile-stress-applying insulating film 150 located on the P-type SRAM region SP and the P-type logic region LP is removed by etching using the first mask 152 as a mask for etching.

Next, in the process step illustrated in FIG. 23B, a compressive-stress-applying insulating film 160 of silicon nitride generating compressive stress is formed by plasma CVD to cover the entire substrate area.

Figure 24A:
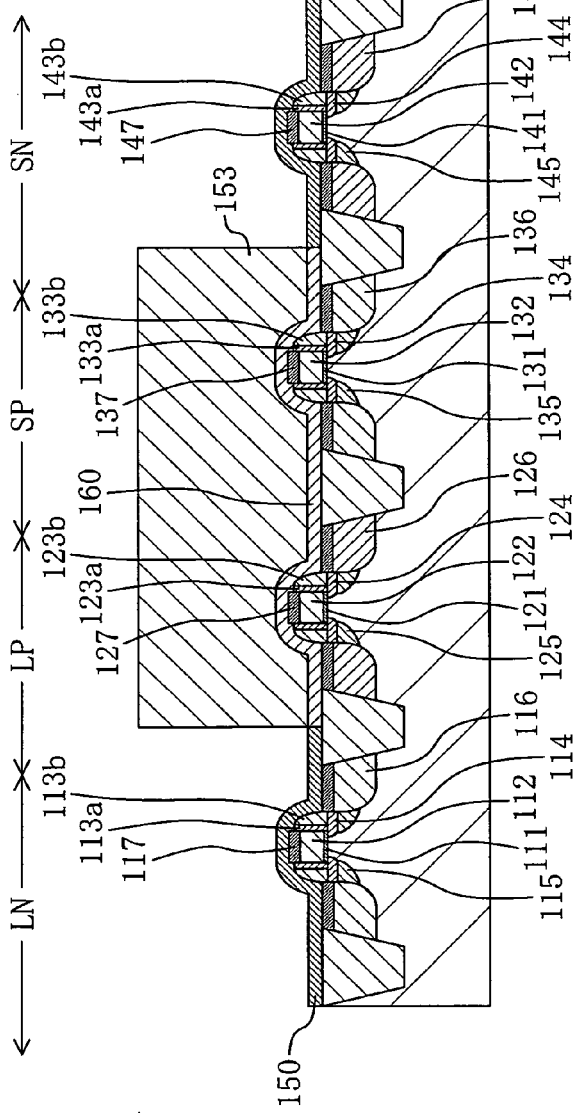
FIGS. 24A and 24B are cross-sectional views illustrating some of the process steps in the fabrication method for a semiconductor device according to the fifth embodiment of the present invention.

Next, in the process step illustrated in FIG. 24A, a second mask 153 of a resist is formed to cover the P-type logic region LP and P-type SRAM region SP of the semiconductor substrate 101 and expose the N-type logic region LN and N-type SRAM region SN thereof.

Figure 24B:
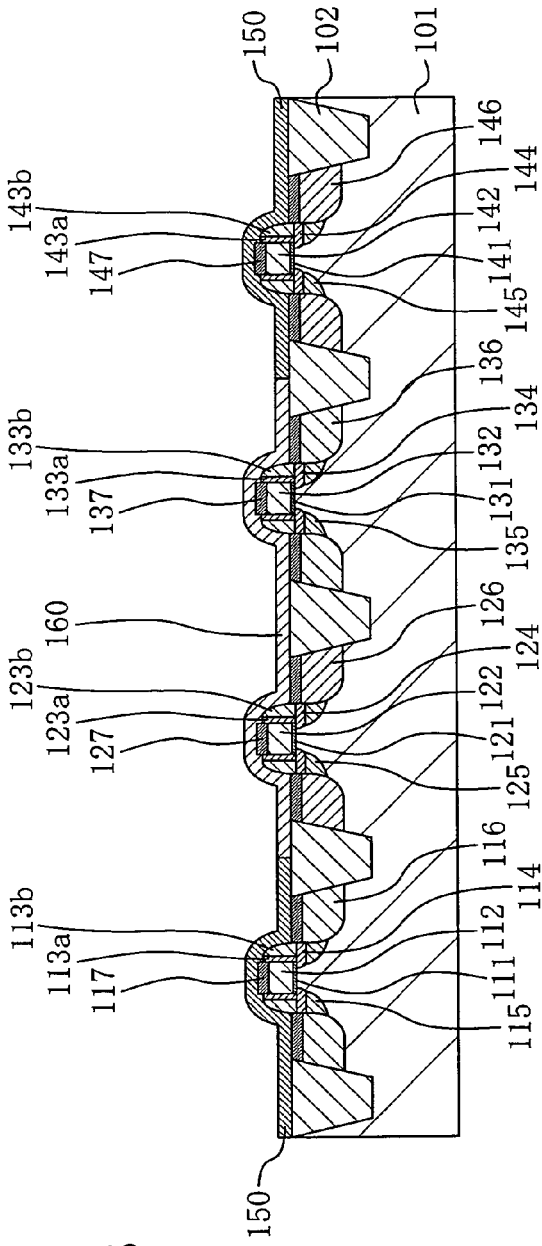

Next, in the process step illustrated in FIG. 24B, the second mask 153 is removed. At this point of this, the compressive-stress-applying insulating film 160 is formed to cover the P-type SRAM region SP and the P-type logic region LP, and the tensile-stress-applying insulating film 150 is formed to cover the N-type logic region LN and the N-type SRAM region SN.

Figures 25A, 25B:
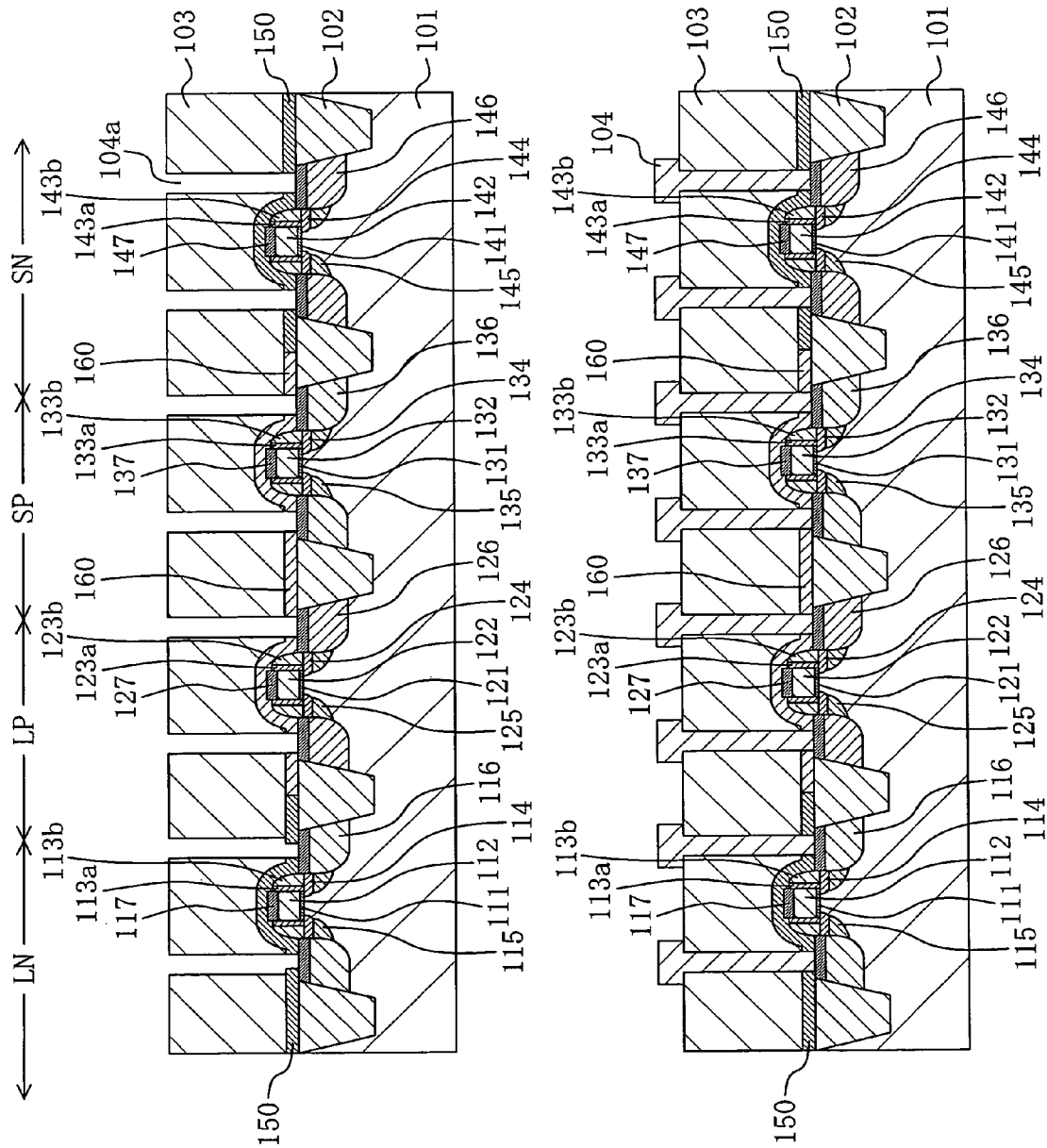
FIGS. 25A and 25B are cross-sectional views illustrating some of the process steps in the fabrication method for a semiconductor device according to the fifth embodiment of the present invention.
Figure 26:
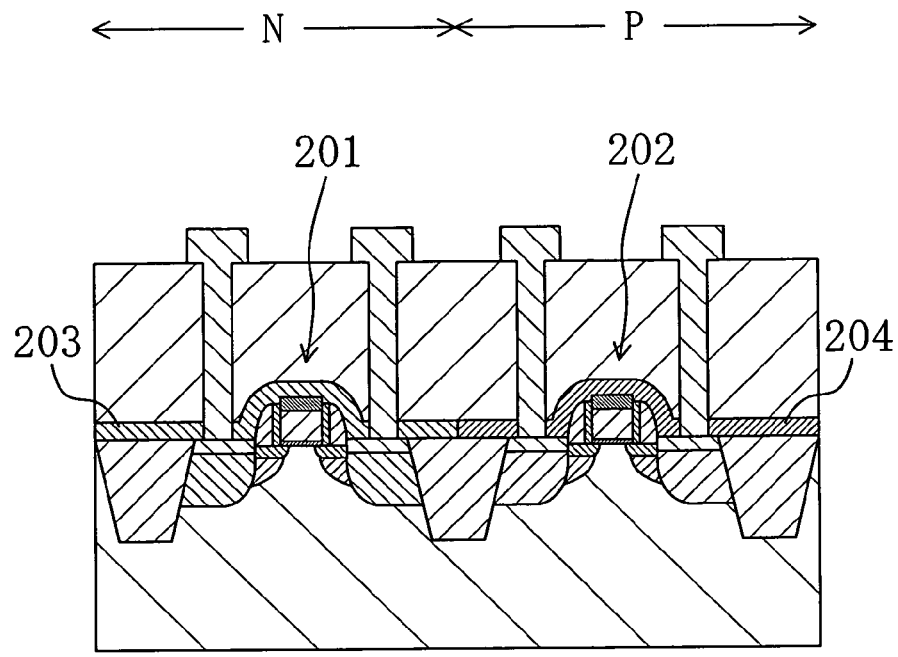
FIG. 26 is a cross-sectional view illustrating the structure of a MIS transistor on which a stress-applying film is formed according to a known art.
Figure 27:
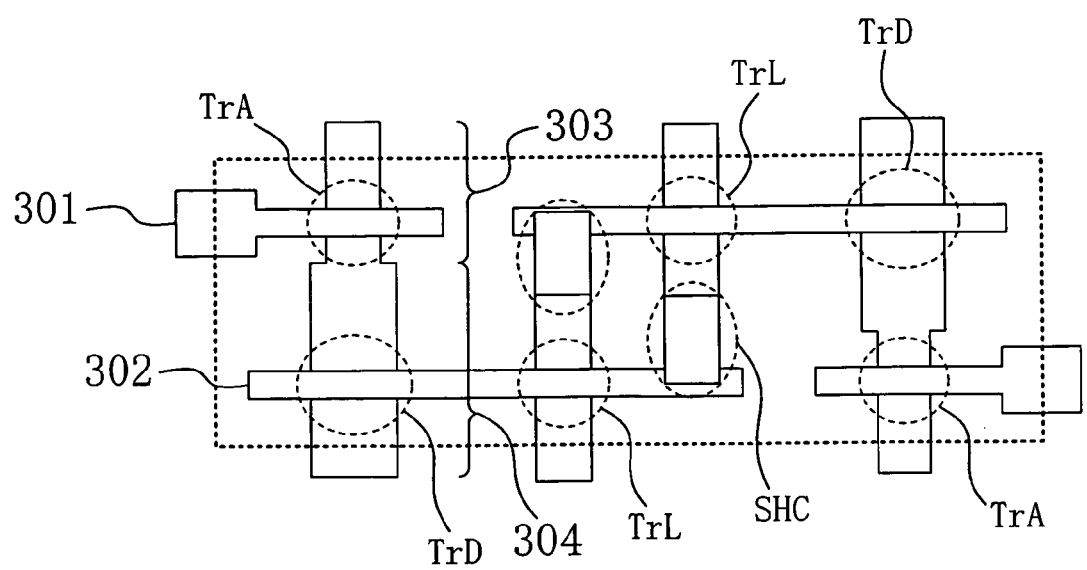
FIG. 27 is a plan view illustrating the configuration of transistors forming an SRAM according to a known art.

Next, in the process step illustrated in FIG. 25A, an interlayer dielectric 103 of an oxide film is formed to cover the entire substrate area. Thereafter, the interlayer dielectric 103, the tensile-stress-applying insulating film 150 and the compressive-stress-applying insulating film 160 are partially etched away by lithography. In this way, contact holes 104a are formed to reach some of the silicide layers 117, 127, 137, and 147 located in the upper portions of the source/drain regions 116, 126, 136, and 146.

Next, in the process step illustrated in FIG. 25B, buried contacts 104 made of a barrier film of TiN or any other material and a metal film of tungsten or any other metal are formed to fill the contact holes 104a. After the above-mentioned process steps, the semiconductor device of this embodiment is fabricated.

In this embodiment, the driving force of a MIS transistor for a logic region can be enhanced. In addition, the driving force of a MIS transistor for an SRAM region can be decreased. In this way, the driving force of transistors can be adjusted according to applications thereof.

What is claimed is:

1. A semiconductor device comprising:
a first MIS transistor including a first gate insulating film formed on a first active region which is made of a semiconductor layer and which is defined by a shallow trench isolation region formed in the semiconductor layer, a first gate electrode formed on the first gate insulating film, and first source/drain regions of an N type formed in regions of the first active region located to both sides of the first gate electrode;
a first insulating film covering the first source/drain regions and the first gate electrode and having a compressive stress;
a second MIS transistor including a second gate insulating film formed on a second active region which is made of the semiconductor layer and is defined by the shallow trench isolation region formed in the semiconductor layer, a second gate electrode formed on the second gate insulating film, and second source/drain regions of the N type formed in regions of the second active region located to both sides of the second gate electrode;
a second insulating film covering the second source/drain regions and the second gate electrode and having a tensile stress;
a third MIS transistor including a third gate insulating film formed on a third active region which is made of the semiconductor layer and which is defined by the shallow trench isolation region formed in the semiconductor layer, a third gate electrode formed on the third gate insulating film, and third source/drain regions of a P type formed in regions of the third active region located to both sides of the third gate electrode,
a third insulating film covering the third source/drain regions and the third gate electrode and having a compressive stress, and
an interlayer dielectric covering the first insulating film, the second insulating film, and the third insulating film,
wherein the first, second and third active regions are electrically isolated by the shallow trench isolation region, and
the first, second and third gate insulating films have a same thickness.

2. The semiconductor device of claim 1, wherein:
a layered film of the first insulating film having a compressive stress and an insulating film having a tensile stress covers the first source/drain regions and the first gate electrode, and
an insulating film having a compressive stress is not formed to cover the second source/drain regions and the second gate electrode.

3. The semiconductor device of claim 1, wherein:
an insulating film having a tensile stress is not formed to cover the first source/drain regions and the first gate electrode, and
a layered film of the second insulating film having a tensile stress and an insulating film having a compressive stress covers the second source/drain regions and the second gate electrode.

4. The semiconductor device of claim 1 wherein the first MIS transistor is an access transistor for an SRAM, the second MIS transistor is a drive transistor for the SRAM, and the third MIS transistor is a load transistor for the SRAM.

5. The semiconductor device of claim 1, wherein the first MIS transistor is a transistor forming an SRAM, and the second MIS transistor is a transistor forming a logic element.

6. The semiconductor device of claim 5 further comprising:
 a fourth MIS transistor including a fourth gate insulating film formed on a fourth active region of the semiconductor layer, a fourth gate electrode formed on the fourth gate insulating film, and fourth source/drain regions of a P type formed in regions of the fourth active region located to both sides of the fourth gate electrode;
 a fifth MIS transistor including a fifth gate insulating film formed on a fifth active region of the semiconductor layer, a fifth gate electrode formed on the fifth gate insulating film, and fifth source/drain regions of a P type formed in regions of the fifth active region located to both sides of the fifth gate electrode;
 a fourth insulating film covering the fourth source/drain regions and the fourth gate electrode and having a compressive stress; and
 a fifth insulating film covering the fifth source/drain regions and the fifth gate electrode and having a tensile stress,
 wherein the fourth MIS transistor is a transistor forming a logic element, and the fifth MIS transistor is a transistor forming an SRAM.

7. The semiconductor device of claim 1, wherein:
 the second insulating film is made of a silicon nitride film formed by LP-CVD, and
 the first and third insulating films are made of a silicon nitride film formed by plasma CVD.

8. The semiconductor device of claim 1, wherein the border between the first insulating film and the second insulating film is located on a part of the shallow trench isolation region between the first active region and the second active region.

9. The semiconductor device of claim 1, wherein the first MIS transistor has a lower driving force than the second MIS transistor.

10. The semiconductor device of claim 1 further comprising:
 first silicide layers formed on the first gate electrode and the first source/drain regions;
 second silicide layers formed on the second gate electrode and the second source/drain regions; and
 third silicide layers formed on the third gate electrode and the third source/drain regions.

11. The semiconductor device of claim 10 further comprising:
 a gate interconnect formed on a portion of the shallow trench isolation region located around the third active region; and
 a fourth silicide layer formed on the gate interconnect,
 wherein the third insulating film covers the gate interconnect.

12. The semiconductor device of claim 11 further comprising
 a shared contact passing through the interlayer dielectric and the third insulating film and being in contact with the third silicide layers on the third source/drain regions and the fourth silicide layer on the gate interconnect.

13. The semiconductor device of claim 12, wherein
 the shared contact is made of a barrier film and a metal film.

14. The semiconductor device of claim 11, wherein
 the first MIS transistor includes first offset sidewalls formed on side surfaces of the first gate electrode, and first sidewalls formed on the side surfaces of the first gate electrode with the first offset sidewalls interposed between the first sidewalls and the first gate electrode,
 the second MIS transistor includes second offset sidewalls formed on side surfaces of the second gate electrode, and second sidewalls formed on the side surfaces of the second gate electrode with the second offset sidewalls interposed between the second sidewalls and the second gate electrode,
 the third MIS transistor includes third offset sidewalls formed on side surfaces of the third gate electrode, and third sidewalls formed on the side surfaces of the third gate electrode with the third offset sidewalls interposed between the third sidewalls and the third gate electrode, and
 fourth offset sidewalls are formed on side surfaces of the gate interconnect, and fourth sidewalls are formed on the side surfaces of the gate interconnect with the fourth offset sidewalls interposed between the fourth sidewalls and the gate interconnect.

15. The semiconductor device of claim 14, wherein
 the fourth sidewalls are formed astride borders between the shallow trench isolation region and the third source/drain regions.

16. The semiconductor device of claim 14, wherein
 the first MIS transistor includes first extension regions of an N type formed in regions of the first active region located under the first offset sidewalls and the first sidewalls, first pocket regions of a P type formed in regions of the first active region located under the first extension regions, and the first source/drain regions formed in regions of the first active region located laterally outwardly of the first sidewalls,
 the second MIS transistor includes second extension regions of an N type formed in regions of the second active region located under the second offset sidewalls and the second sidewalls, second pocket regions of a P type formed in regions of the second active region located under the second extension regions, and the second source/drain regions formed in regions of the second active region located laterally outwardly of the second sidewalls, and
 the third MIS transistor includes third extension regions of a P type formed in regions of the third active region located under the third offset sidewalls and the third sidewalls, third pocket regions of a P type formed in regions of the third active region located under the third extension regions, and the third source/drain regions formed in regions of the third active region located laterally outwardly of the third sidewalls.

17. The semiconductor device of claim 1, wherein
 the first and third insulating films are portions of a continuous insulating film, and
 the second insulating film is an insulating film different from the first and third insulating films.

* * * * *